(12) United States Patent
Lee et al.

(10) Patent No.: US 12,598,754 B2
(45) Date of Patent: Apr. 7, 2026

(54) ELECTRONIC DEVICE HAVING STACKED STRUCTURES AND METHOD FOR MANUFACTURING THE SAME

(71) Applicant: SK hynix Inc., Gyeonggi-do (KR)

(72) Inventors: Ki Hong Lee, Gyeonggi-do (KR); Ji Yeon Baek, Gyeonggi-do (KR); Seung Ho Pyi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/764,371

(22) Filed: Jul. 5, 2024

(65) Prior Publication Data

US 2024/0365548 A1      Oct. 31, 2024

Related U.S. Application Data

(60) Continuation of application No. 18/318,739, filed on May 17, 2023, now Pat. No. 12,048,161, which is a
(Continued)

(30) Foreign Application Priority Data

Dec. 29, 2014    (KR) ........................ 10-2014-0192025

(51) Int. Cl.
H10B 43/27      (2023.01)
H01L 21/768      (2006.01)
(Continued)

(52) U.S. Cl.
CPC ....... H10B 43/27 (2023.02); H01L 21/76898 (2013.01); H10B 43/10 (2023.02); H10B 43/35 (2023.02)

(58) Field of Classification Search
CPC ........ H10B 43/27; H10B 43/35; H10B 43/10; H01L 21/76898
(Continued)

(56) References Cited

U.S. PATENT DOCUMENTS 5,320,684 A * 6/1994 Amick ................. H10F 77/211
438/98
5,391,236 A * 2/1995 Krut ...................... H10F 77/211
438/81
(Continued)

OTHER PUBLICATIONS

Office Action for U.S. Appl. No. 18/757,497 issued by the USPTO on Jan. 13, 2025.

*Primary Examiner* — Jami Valentine Miller
(74) *Attorney, Agent, or Firm* — IP & T GROUP LLP

(57) ABSTRACT

A method for manufacturing an electronic device includes forming a first source layer including a trench, forming a first sacrificial layer in the trench, forming a first structure over the first source layer, wherein the first structure includes first material layers and second material layers which are alternately stacked over the each other, forming first openings passing through the first structure and extending to the first sacrificial layer, forming first channel layers in the first openings, forming a slit passing through the first structure and extending to the first sacrificial layer, forming a second opening by removing the first sacrificial layer through the slit, and forming a second source layer in the second opening, wherein the second source layer is coupled to the first channel layers.

8 Claims, 37 Drawing Sheets

Related U.S. Application Data continuation of application No. 17/151,412, filed on Jan. 18, 2021, now Pat. No. 11,678,487, which is a continuation of application No. 16/298,923, filed on Mar. 11, 2019, now Pat. No. 10,923,497, which is a continuation of application No. 15/821,388, filed on Nov. 22, 2017, now Pat. No. 10,269,827, which is a continuation of application No. 15/398,467, filed on Jan. 4, 2017, now Pat. No. 9,991,279, which is a division of application No. 14/732,390, filed on Jun. 5, 2015, now Pat. No. 9,570,462.

(51) Int. Cl.
*H10B 43/10* (2023.01)
*H10B 43/35* (2023.01)

(58) Field of Classification Search
USPC ........................................................ 257/268
See application file for complete search history.

(56) References Cited

U.S. PATENT DOCUMENTS

| | | | | |
|---|---|---|---|---|
| 6,057,224 | A * | 5/2000 | Bothra | H01L 21/7682 |
| | | | | 438/622 |
| 6,140,980 | A * | 10/2000 | Spitzer | H10H 29/142 |
| | | | | 257/E29.295 |
| 10,269,827 | B2 * | 4/2019 | Lee | H10B 43/10 |
| 11,562,945 | B2 * | 1/2023 | Wu | H10B 43/40 |
| 11,805,654 | B2 * | 10/2023 | Takaki | H01L 23/5283 |
| 2006/0157683 | A1 * | 7/2006 | Scheuerlein | H10B 63/84 |
| | | | | 257/4 |
| 2008/0123390 | A1 * | 5/2008 | Kim | H10B 63/10 |
| | | | | 257/E21.078 |
| 2009/0085104 | A1 * | 4/2009 | Weber | H10D 30/0297 |
| | | | | 438/270 |
| 2010/0044756 | A1 * | 2/2010 | Hsia | H10B 20/20 |
| | | | | 257/209 |
| 2010/0109072 | A1 * | 5/2010 | Kidoh | H10D 88/00 |
| | | | | 257/E21.679 |
| 2013/0100741 | A1 * | 4/2013 | Choi | G11C 16/28 |
| | | | | 257/E21.422 |
| 2013/0320424 | A1 * | 12/2013 | Lee | H10D 30/689 |
| | | | | 257/314 |
| 2015/0115344 | A1 * | 4/2015 | Lai | H10B 43/35 |
| | | | | 257/314 |
| 2015/0155297 | A1 * | 6/2015 | Eom | H10D 30/693 |
| | | | | 438/268 |
| 2015/0348976 | A1 * | 12/2015 | Moon | H10D 30/635 |
| | | | | 438/270 |
| 2017/0062462 | A1 * | 3/2017 | Lee | H10B 43/27 |
| 2017/0170057 | A1 * | 6/2017 | Huo | H10B 43/50 |
| 2018/0097012 | A1 * | 4/2018 | Lee | H01L 21/76898 |
| 2022/0028878 | A1 * | 1/2022 | Park | H01L 23/535 |
| 2023/0021060 | A1 * | 1/2023 | Hopkins | H10B 41/10 |
| 2024/0282673 | A1 * | 8/2024 | Wu | H10B 43/35 |

* cited by examiner 34    33        A-A'                    T

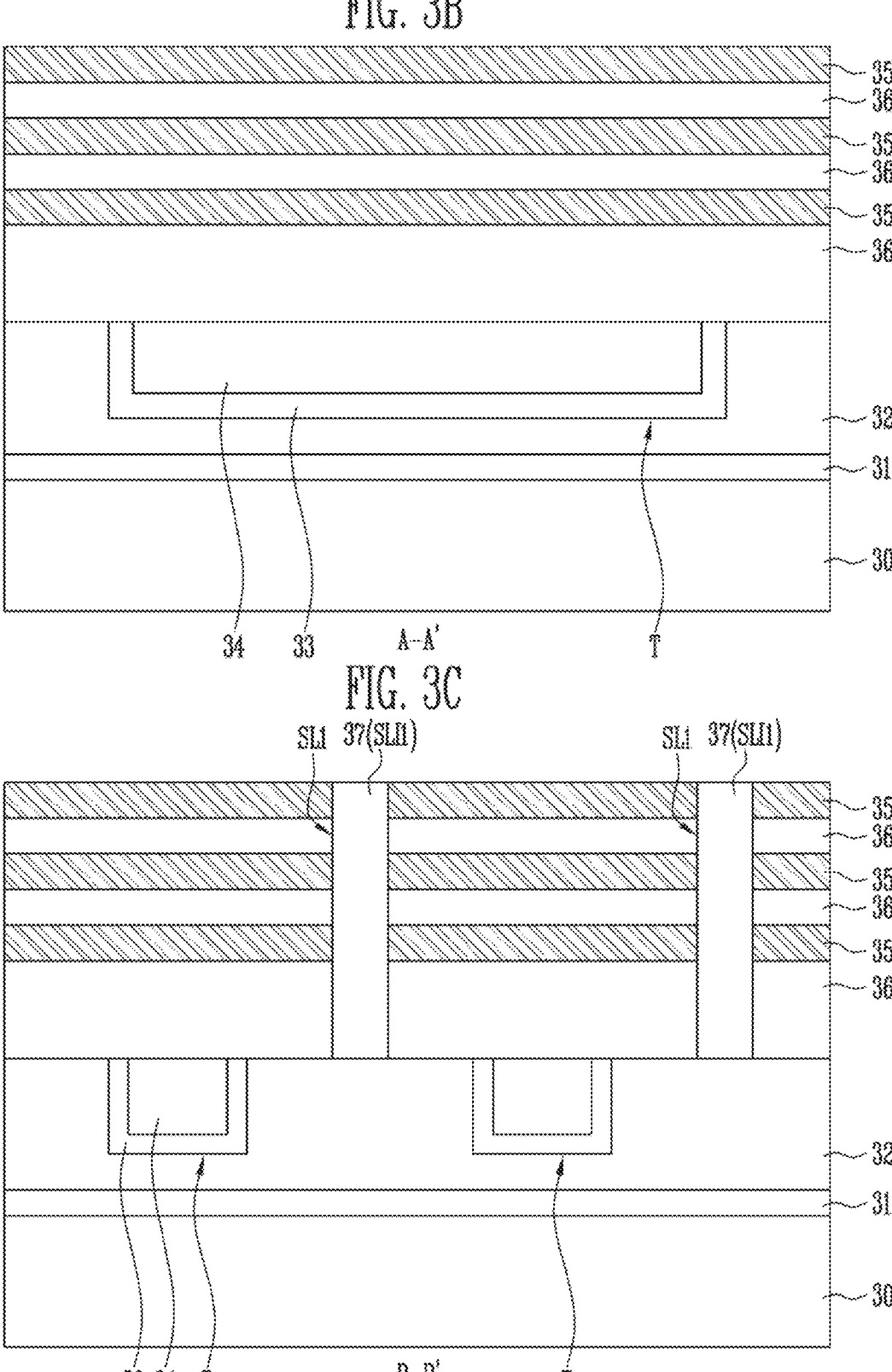

ELECTRONIC DEVICE HAVING STACKED STRUCTURES AND METHOD FOR MANUFACTURING THE SAME

CROSS-REFERENCE TO RELATED APPLICATION

This application is a continuation of U.S. patent application Ser. No. 18/318,739 filed on May 17, 2023, which is a continuation of U.S. patent application Ser. No. 17/151,412 filed on Jan. 18, 2021, and now U.S. Pat. No. 11,678,487 issued on Jun. 13, 2023, which is a continuation of U.S. patent application Ser. No. 16/298,923 filed on Mar. 11, 2019, and now U.S. Pat. No. 10,923,497 issued on Feb. 16, 2021, which is a continuation of U.S. patent application Ser. No. 15/821,388 filed on Nov. 22, 2017, and now U.S. Pat. No. 10,269,827 issued on Apr. 23, 2019, which is a continuation of U.S. patent application Ser. No. 15/398,467 filed on Jan. 4, 2017, and now U.S. Pat. No. 9,991,279 issued on Jun. 5, 2018, which is a division of U.S. patent application Ser. No. 14/732,390 filed on Jun. 5, 2015, and now U.S. Pat. No. 9,570,462 issued on Feb. 14, 2017, which claims priority to Korean patent application number 10-2014-0192025, filed on Dec. 29, 2014. The disclosure of each of the foregoing applications is incorporated herein by reference in its entirety.

BACKGROUND

Field of Invention

Various exemplary embodiments relate generally to an electronic device and a method for manufacturing the same, and more particularly, to an electronic device including a data storage unit having a three-dimensional structure and a method for manufacturing the same.

Description of Related Art

All types of electronic devices include data storage units although these data storage units may have different functions and configurations. Performance improvement of electronic devices is continuously evolving. Accordingly, data storage units having a high performance and high capacity in addition to performance improvement are in demand. To achieve such requirements, proposals for electronic devices including high performance, high-capacity data storage units have been made.

The number of electronic devices requiring data storage units which retain data even though power is turned off, is increasing. Recently, data storage units having high storage capacity and high read and write speeds, in addition to retaining data, have been required. Therefore, technical development is being actively conducted to meet these requirements.

SUMMARY

An embodiment is directed to an electronic device having improved characteristics and that is easy to manufacture, and a manufacturing method thereof.

A method of manufacturing an electronic device according to an embodiment may include forming a first source layer including a trench, forming a first sacrificial layer in the trench, forming a first structure over the first source layer, wherein the first structure includes first material layers and second material layers which are alternately stacked over the each other, forming first openings passing through the first structure and extending to the first sacrificial layer, forming first channel layers in the first openings, forming a slit passing through the first structure and extending to the first sacrificial layer, forming a second opening by removing the first sacrificial layer through the slit, and forming a second source layer in the second opening, wherein the second source layer is coupled to the first channel layers.

A method of manufacturing an electronic device according to an embodiment may include forming a first sacrificial layer, forming a stacked structure including a through hole, over the first sacrificial layer, forming a pillar including a through portion and a protruding portion, wherein the through portion is located in the through hole, and wherein the protruding portion extends between the through portion and the first sacrificial layer, removing the first sacrificial layer, and forming a conductive layer contacting the pillar, wherein the conductive layer surrounds the protruding portion and a lower portion of the through portion adjacent to the protruding portion.

An electronic device according to an embodiment may include a first source layer including a trench, a second source layer formed in the trench and over the first source layer, a first structure formed over the second source layer and including a plurality of first conductive layers and a plurality of first insulating layers which are alternately stacked in a vertical direction, and first channel layers each passing through the first structure and extending to the second source layer, wherein the second source layer includes a base portion and protruding portions, wherein the base portion couples the first channel layers to each other in the trench, and wherein the protruding portions extend upward from the base portion to surround sidewalls of the first channel layers, respectively.

An electronic device according to an embodiment may include a first conductive layer, a stacked structure formed over the first conductive layer and including a through hole, a pillar including a through portion and a protruding portion, wherein the through portion is formed in the through hole, wherein the protruding portion extends from the through portion down to the first conductive layer, a second conductive layer formed between the first conductive layer and the stacked structure and surrounding the protruding portion of the pillar, wherein the second conductive layer is electrically connected to the first conductive layer, and a dielectric layer provided between the through portion of the pillar and the stacked structure.

BRIEF DESCRIPTION OF THE DRAWINGS

FIGS. 2A to 8A, FIGS. 2B to 8B, and FIGS. 3C and 6C are views illustrating a method of manufacturing an electronic device according to an embodiment;

FIGS. 12A to 16A and FIGS. 12B to 16B are enlarged views illustrating a method of manufacturing an electronic device according to an embodiment;

DETAILED DESCRIPTION

Figure 1A:
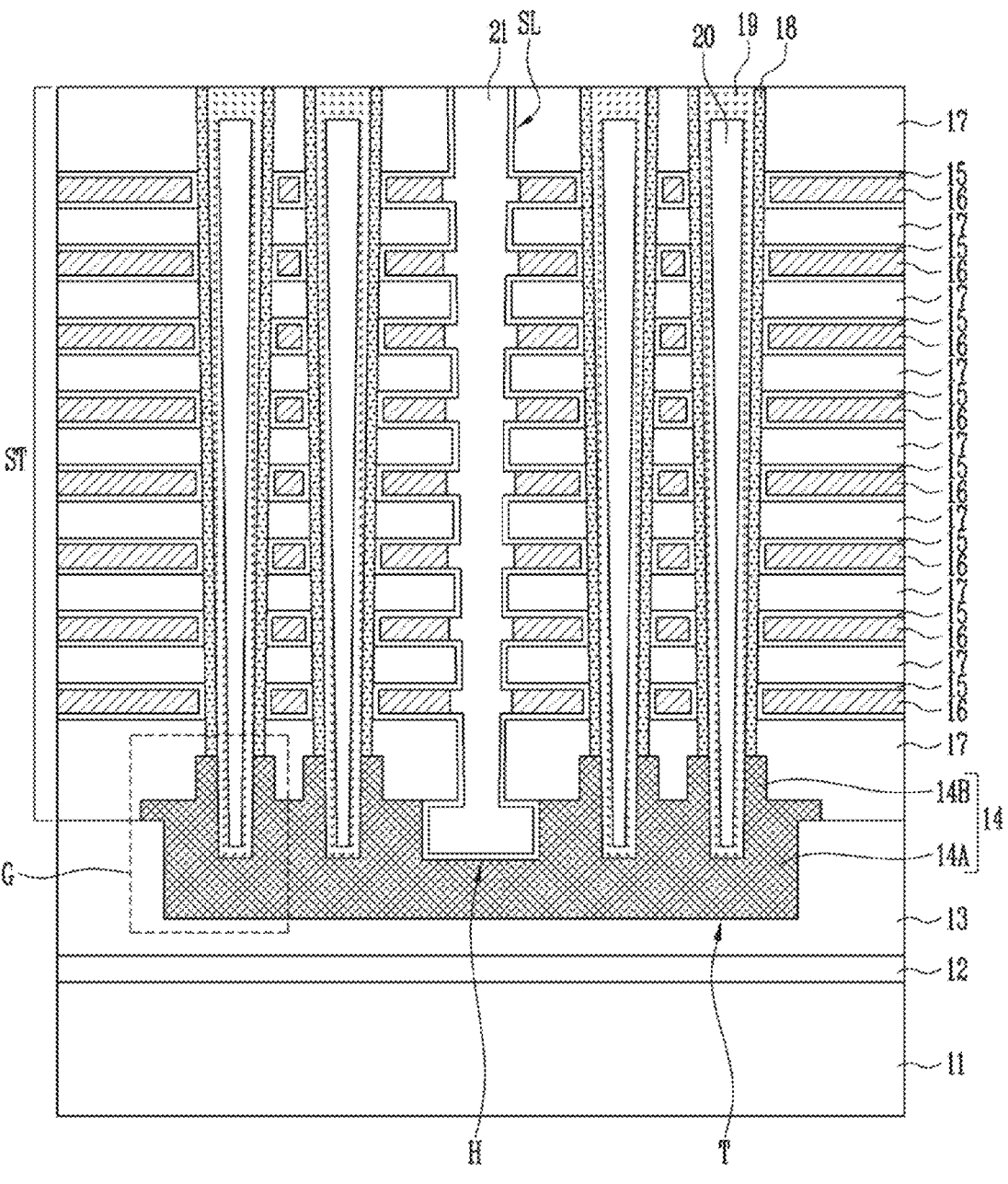
FIGS. 1A and 1B are cross-sectional views illustrating the structure of an electronic device according to an embodiment.

Hereinafter, various exemplary embodiments will be described in detail with reference to the accompanying drawings.

The drawings are not necessarily illustrated at the specific ratio, and in some exemplary embodiments, in order to clearly show the features of the embodiments, at least some of the structures shown in the drawings may be exaggerated. When a multilayer structure including at least two layers is disclosed in the drawings or the detailed description of the invention, the relative positional relationship between the layers, or arrangement thereof merely reflect the specific embodiment. Thus, the present invention is not limited thereto, and such relative positional relationship and the arrangement may vary. In addition, the drawings or the detailed description of the multilayer structure may not reflect every layer existing in the specific multilayer structure, for example, at least one additional layer may exist between the illustrated two layers. For example, when a first layer is formed on a second layer or on a substrate in the multilayer structure shown in the drawings or the detailed description, the first layer may be directly formed on the second layer or directly formed on the substrate, and at least one layer may also exist between the first layer and the second layer or between the first layer and the substrate.

Figure 1B:
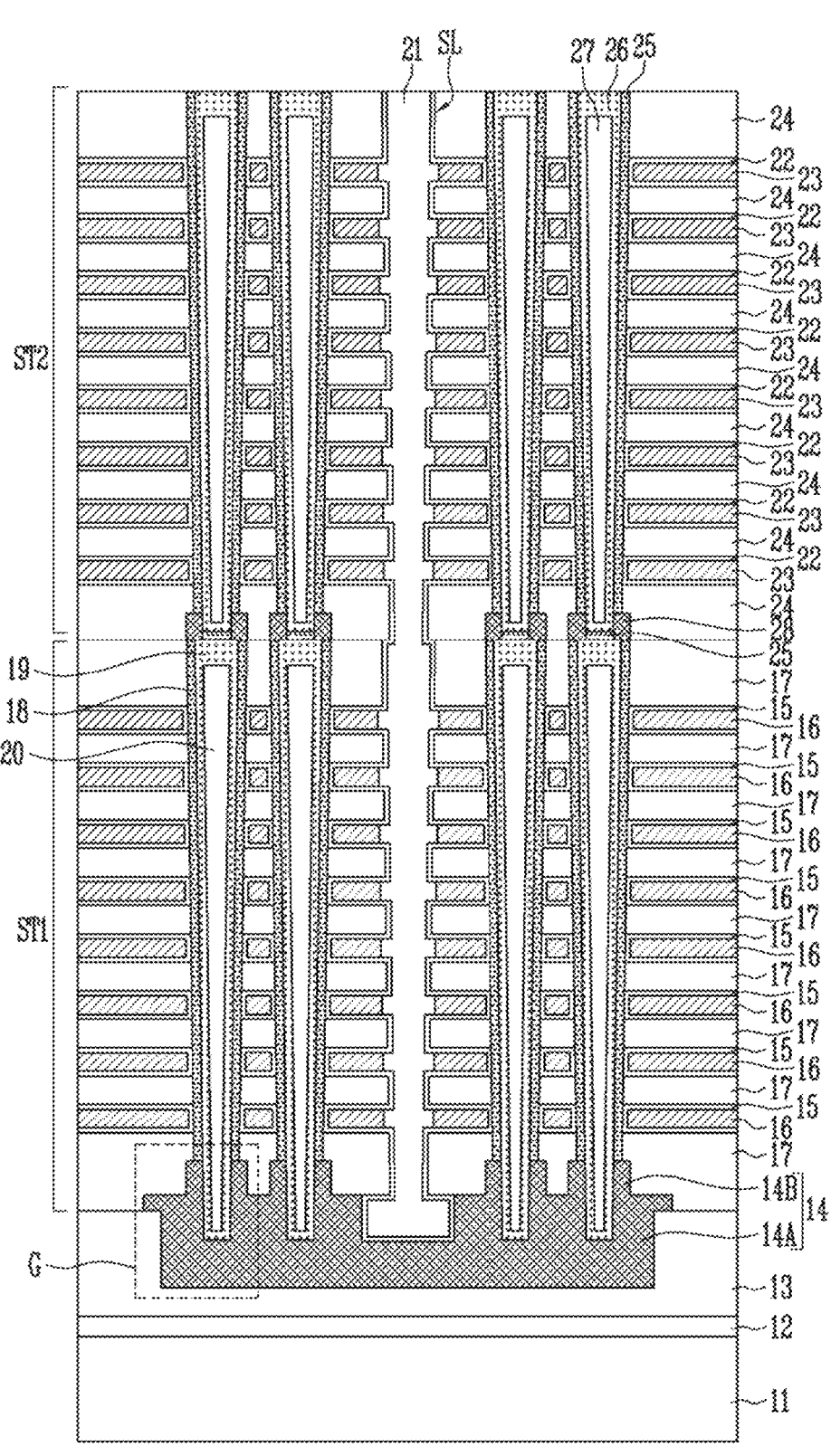

FIGS. 1A and 1B are cross-sectional views illustrating the structure of an electronic device according to an embodiment. The electronic device may be a semiconductor device, and the semiconductor device may include a volatile memory device or a non-volatile memory device.

Referring to FIG. 1A, an electronic device according to an embodiment may include a first source layer 13, a second source layer 14, a structure ST and pillars 19.

The first source layer 13 may be a separate layer configured as source, or be formed by doping a substrate 11 with impurities. According to an embodiment, the first source layer 13 may include a conductive layer including, for example, doped polysilicon. In this embodiment, the electronic device may further include the substrate 11 located under the first source layer 13 and an insulating layer 12 insulating the substrate 11 from the first source layer 13. However, when the first source layer 13 is formed by doping the substrate 11 with impurities, the second source layer 14 may be formed in the substrate 11 and directly contact the substrate 11.

The second source layer 14 may be a conductive layer including, for example, doped silicon and formed in a trench T in the first source layer 13. The second source layer 14 may include a base portion 14A formed in the trench T and protruding portions 14B protruding from the base portion 14A. The base portion 14A may electrically connect neighboring pillars 19. Each of the protruding portions 14B may surround a portion of the pillar 19 and extend into the structure ST. For example, each of the protruding portions 14B may surround a lower portion of the pillar 19. In addition, the second source layer 14 may include a groove H formed in a top surface thereof.

The structure ST may have a stacked body including a plurality of layers stacked on top of each other. The structure ST may include conductive layers 16 and insulating layers 17 stacked alternately with each other. The insulating layer 17 may form the lowest portion of the structure ST which contacts the first conductive layer 13. The lowest insulating layer 17 may be thick enough to insulate the second source layer 14 from the conductive layer 16, and have a greater thickness than the other insulating layers 17. For example, the thickness of the lowest insulating layer 17 may be determined in consideration of the height of the protruding portion 14B of the second source layer 14.

The conductive layers 16 may be gate electrodes of memory cells or selection transistors. For example, at least one lowermost conductive layer 16 may be a lower selection gate of a lower selection transistor, at least one uppermost conductive layer 16 may be an upper selection gate electrode of an upper selection transistor, and the other conductive layers 16 may be gate electrodes of memory cells. The conductive layers 16 may include, for example but are not limited to, silicon, tungsten, tungsten nitride, titanium, titanium nitride, tantalum, tantalum nitride, or the like. In addition, the insulating layers 17 may be insulators for insulating the stacked gate electrodes from each other. For example, the insulating layers 17 may include an oxide, a nitride, or the like. The structure ST may further include dielectric layers 15 surrounding the conductive layers 16. The dielectric layers 15 may be charge blocking layers.

The pillars 19 may pass through the structure ST and extend into the base portion 14A of the second source layer 14. The pillars 19 may include semiconductor layers and be channel layers forming a memory string.

The pillars 19 may be electrically connected to the second source layer 14 and share the second source layer 14. Each of the pillars 19 may include a central portion that may be completely filled, an open central portion, or a combination thereof. The open central portion of each pillar 19 may be filled with a gap-filling insulating layer 20.

Dielectric layers 18 may be interposed between the pillars 19 and the conductive layers 16. Each of the dielectric layers 18 may surround a sidewall of the pillar 19 and be interposed between the pillar 19 and the structure ST. The dielectric layer 18 may have a stacked structure including dielectric layers having different etch selectivities. For example, the dielectric layer 18 may include a first oxide layer, a nitride layer and a second oxide layer stacked in a sequential manner. When the dielectric layer 18 is a memory layer, the dielectric layer 18 may include at least one of a tunnel insulating layer, a data storage layer and a charge blocking layer. The data storage layer may include, for example but is not limited to, silicon, nitride, nanodots, phase-change materials, or the like.

A slit SL may be located between the pillars 19. The slit SL may pass through the structure ST and extend to the second source layer 14. The slit SL may be formed to expose the groove H of the second source layer 14. The slit SL may be filled with a slit insulating layer 21. For example, the slit insulating layer 21 may include an oxide. In addition, the dielectric layers 15 surrounding the conductive layers 16 may be formed along inner surfaces of the slit SL and the groove H.

In referring to FIG. 1B, a first structure ST1 and a lower structure formed under the first structure ST1 may be configured as described above with reference to FIG. 1A. In addition, a second structure ST2 may be formed on the first structure ST1.

The second structure ST2 may include conductive layers 23 and insulating layers 24 stacked alternately with each other. Second channel layers 26 may pass through the second structure ST2 and be coupled to first channel layers 19, respectively. Second memory layers 25 may be interposed between the second channel layers 26 and the second structure ST2. Coupling patterns 28 may be formed at lower sidewalls of the second channel layers 26 not surrounded by the second memory layer 25. The coupling patterns 28 may directly contact lower portions of the second channel layers 26 and upper portions of the first channel layers 19 and couple the first and second channel layers 19 and 26 to each other. In addition, the coupling patterns 28 may be formed in the insulating layer 24.

The slit SL may pass through the first and second structures ST1 and ST2, and the slit insulating layer 21 may be formed through the first and second structures ST1 and ST2.

In the first and second structures ST1 and ST2 having the above-described structure, at least one lower selection transistor, a plurality of memory cells, and at least one upper selection transistor may be coupled in series to form a single string. A plurality of strings may be arranged in a vertical direction. In addition, the plurality of strings may share the first and second source layers 13 and 14.

Figure 1C:
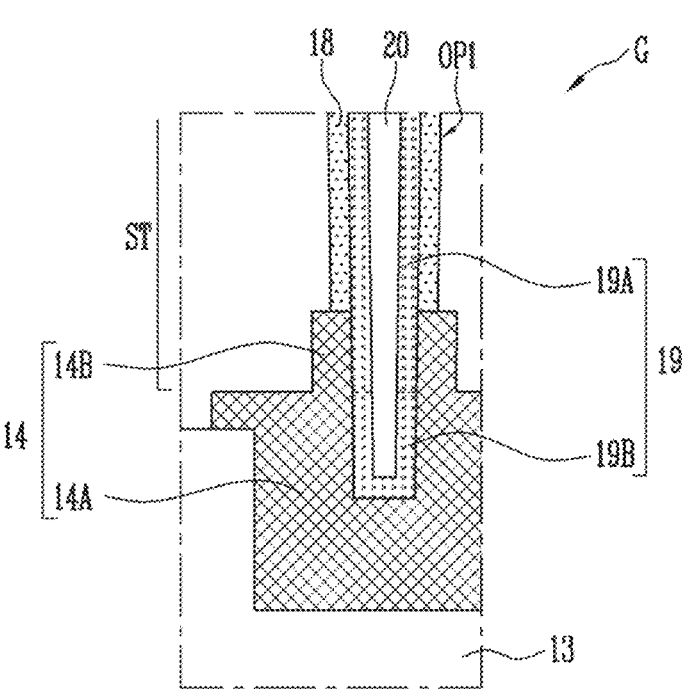
FIG. 1C is an enlarged view of a region G shown in FIGS. 1A and 1B.

FIG. 1C is an enlarged view of a region G shown in FIGS. 1A and 1B. Referring to FIG. 1C, the structure ST may include a first opening OP1. The first opening OP1 may be a through hole passing through the structure ST. The pillar 19 may include a through portion 19A formed in the through hole and a protruding portion 19B coupled to the through portion 19A and inserted or extending into the first conductive layer 13.

The base portion 14A of the second source layer 14 may be formed in the first source layer 13 to surround the protruding portion 19B of the pillar 19. In addition, the protruding portion 14B of the second source layer 14 may protrude from the base portion 14A and be formed in the structure ST. The protruding portion 14B may partially surround a portion of the through portion 19A adjacent to the protruding portion 19B of the pillar 19.

In addition, the dielectric layer 18 may be formed on a sidewall of the through portion 19A of the pillar 19 not surrounded by the second source layer 14. That is, the dielectric layer 18 may be interposed between the pillar 19 not surrounded by the second source layer 14 and the structure ST.

FIGS. 2A to 8A, FIGS. 2B to 8B, and FIGS. 3C and 6C are views illustrating a method of manufacturing an electronic device according to an embodiment. More specifically, FIGS. 2A to 8A are layout views, FIGS. 2B to 8B are cross-sectional views taken along the line A-A' of FIGS. 2A to 8A, respectively, and FIGS. 3C and 6C are cross-sectional views taken along the line B-B' of FIGS. 3A and 6A, respectively.

Figure 2A:
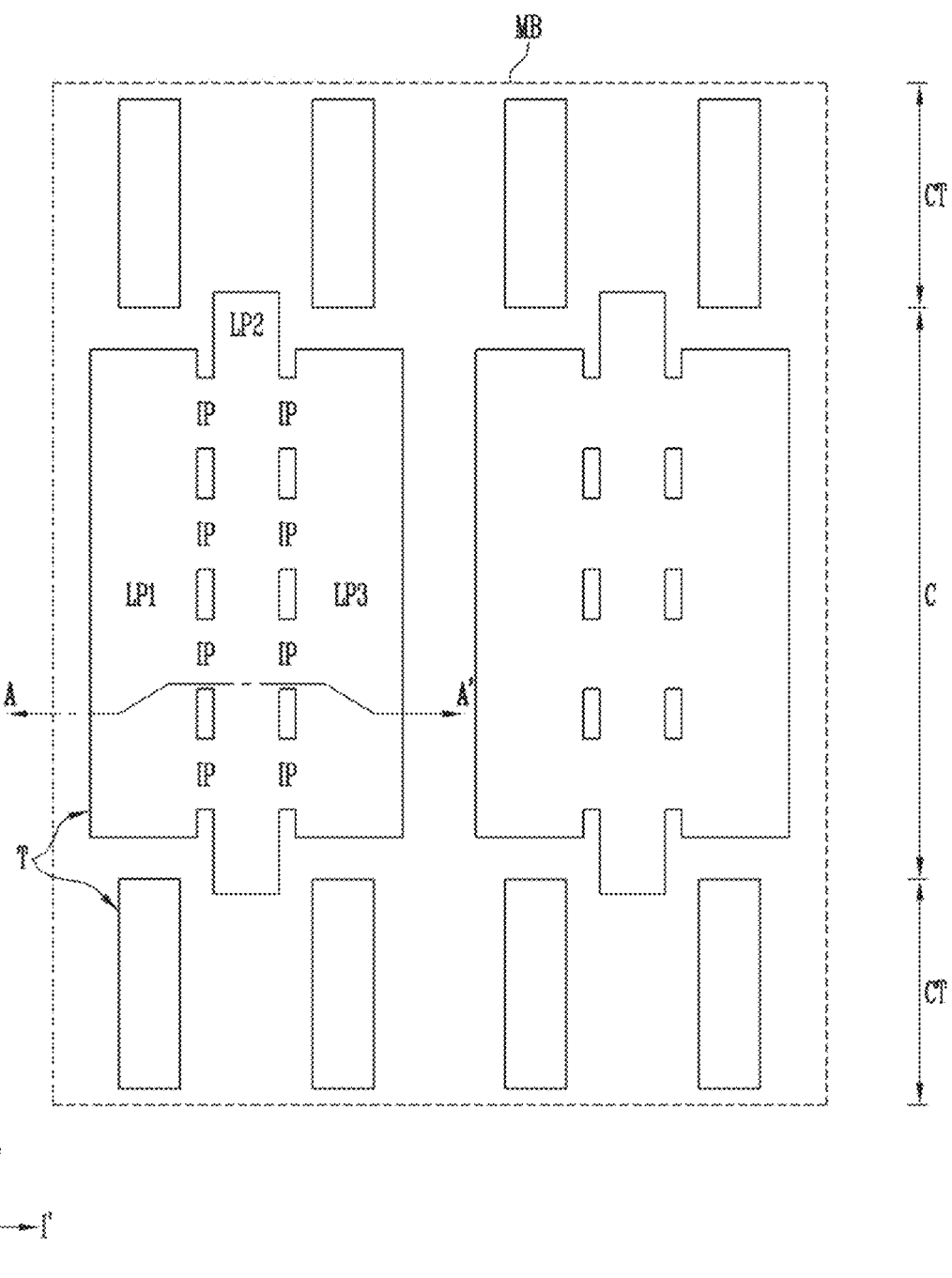
Figure 2B:
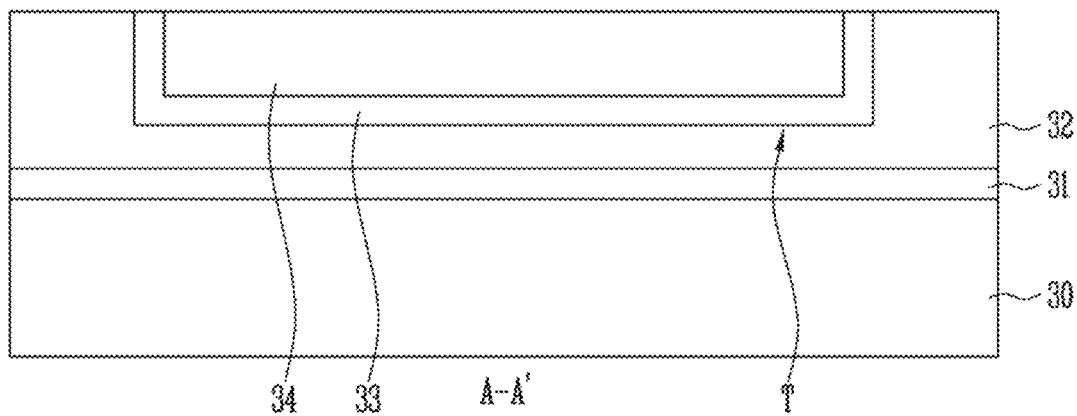
Figure 3A:
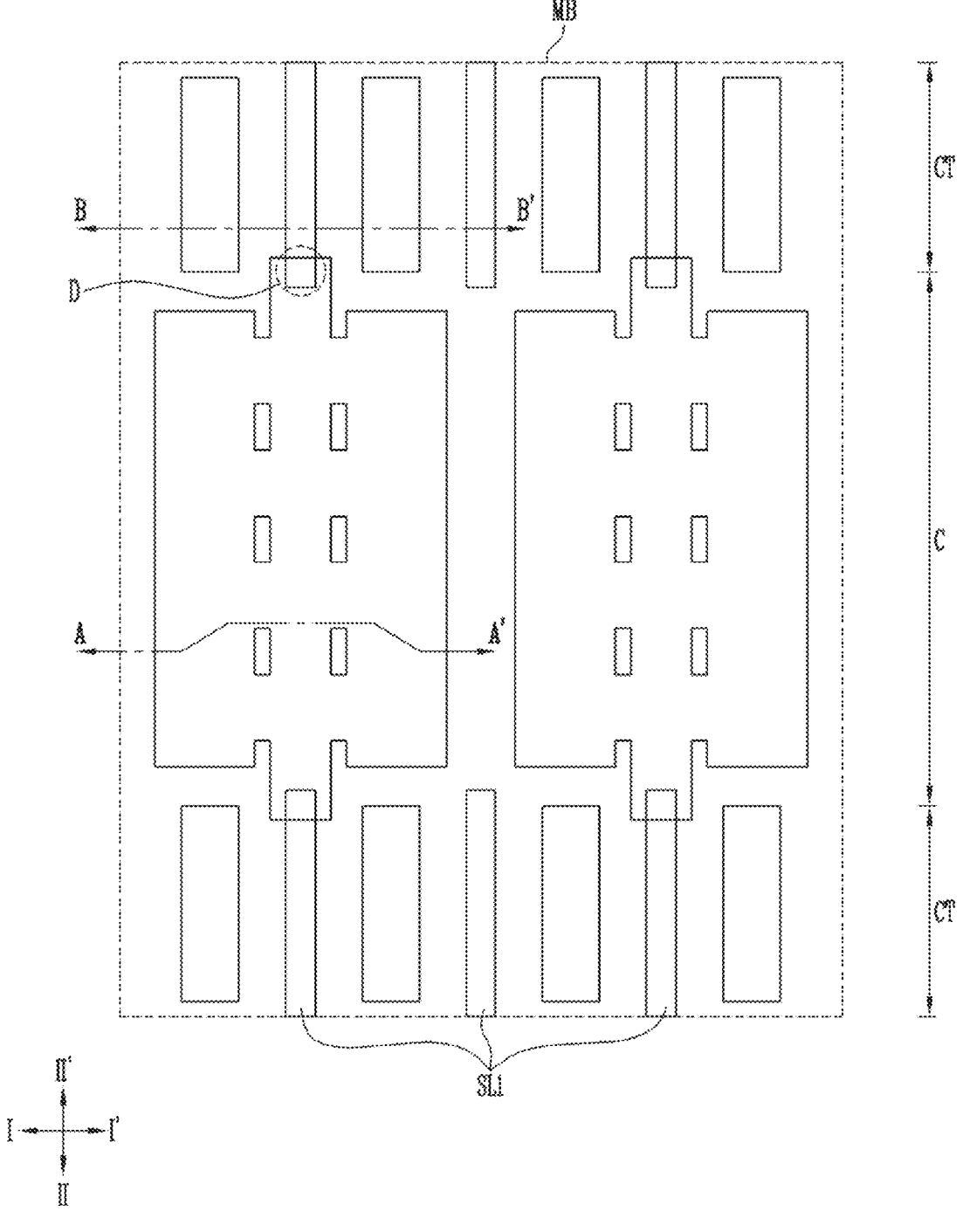

Referring to FIGS. 2A and 2B, a first insulating layer 31 and a first conductive layer 32 may be sequentially formed on a substrate 30. The first conductive layer 32 may be a first source layer and include doped polysilicon. The first insulating layer 31 may insulate the substrate 30 from the first conductive layer 32.

Subsequently, the trench T may be formed in the first conductive layer 32. The trench T may be located in either or both of a cell region C and a contact region CT. The trench T located in the cell region C may include first, second and third line patterns LP1, LP2 and LP3 extending in a second direction II-II', for example, in a first horizontal direction, and island patterns IP coupling the first to third line patterns LP1 to LP3. Each of the island patterns IP couples two or more of the first, second and third line patterns to each other and extends in a first direction I-I', for example, in a second horizontal direction across the first horizontal direction. The first to third line patterns LP1 to LP3 may have the same or different lengths, and the same or different widths. According to an embodiment, during subsequent processes, pillars may be formed on the first and third line patterns LP1 and LP3, and a slit may be formed on the second line pattern LP2. Therefore, each of the first and third line patterns LP1 and LP3 may have a greater width than the second line pattern LP2, and the second line pattern LP2 may have a greater length than the first and third line patterns LP1 and LP3. The second line pattern LP2 may extend to the contact region CT.

Subsequently, a first sacrificial layer 34 may be formed in the trench T. The first sacrificial layer 34 may include doped polysilicon, undoped polysilicon, or the like. Before the first sacrificial layer 34 is formed, a second sacrificial layer 33 may be formed on an inner surface of the trench T. The second sacrificial layer 33 may include a material having a high etch selectivity with respect to the first sacrificial layer 34. The second sacrificial layer 33 may include at least one of oxide, nitride, titanium (Ti), titanium nitride (TiN) and metal. For example, after the second sacrificial layer 33 is formed along the entire surface of the first conductive layer 32 including the trench T, a first sacrificial layer 34 may be formed on the first conductive layer 32 to fill the trench T. Subsequently, a planarization process may be formed until the surface of the first conductive layer 32 is exposed. Therefore, the first and second sacrificial layers 34 and 33 may be formed in the trench T.

Referring to FIGS. 3A to 3C, a lower structure may be formed on the first conductive layer 32. The lower structure may include one or more first material layers 35 and one or more second material layers 36 stacked alternately with each other. The first material layer 35 may be stacked to form a gate electrode of a lower selection transistor, and the second material layer 36 may be formed to insulate the stacked gate electrodes from each other.

The first material layer 35 may include a high etch selectivity with respect to the second material layer 36. For example, the first material layer 35 may include a sacrificial layer including a nitride, and the second material layer 36 may include an insulating layer including an oxide. In another example, the first material layer 35 may include a conductive layer including doped polysilicon, doped amorphous silicon, or the like. The second material layer 36 may include an insulating layer including an oxide. According to an embodiment, the first material layer 35 may include a sacrificial layer, and the second material layer 36 may include an insulating layer.

Subsequently, first slits SL1 may pass through the lower structure, and second insulating layers 37 may be formed in the first slits SL1. The second insulating layer 37 may be a first slit insulating layer which patterns the lower structure. The second insulating layer 37 may be located between the trenches T in the contact region CT, and have a linear shape extending in the second direction II-II'. In addition, a portion of the second insulating layer 37 may overlap the trench T in the cell region C, more particularly, the second line pattern LP2 in the trench T (see reference character D).

Figure 4A:
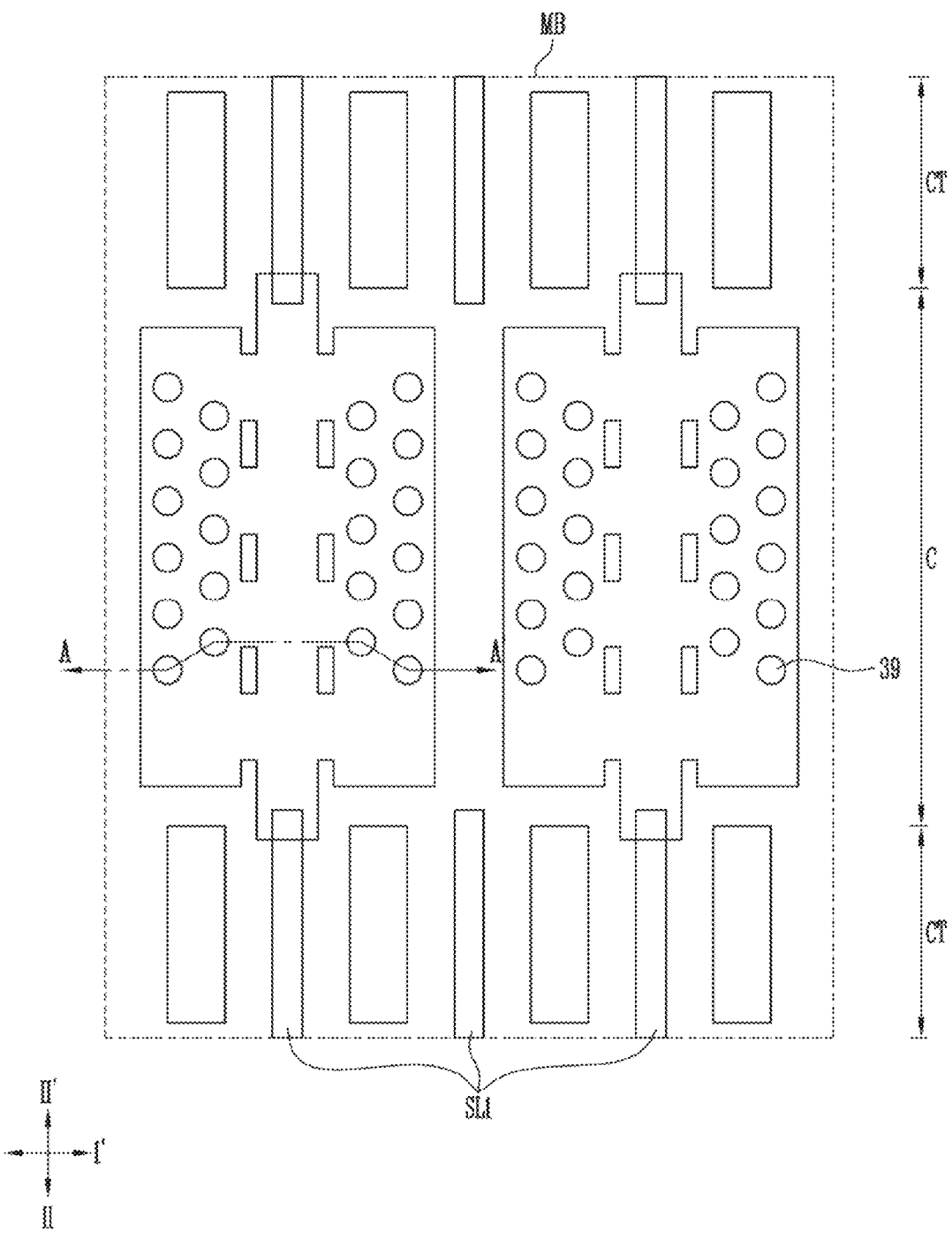
Figure 4B:
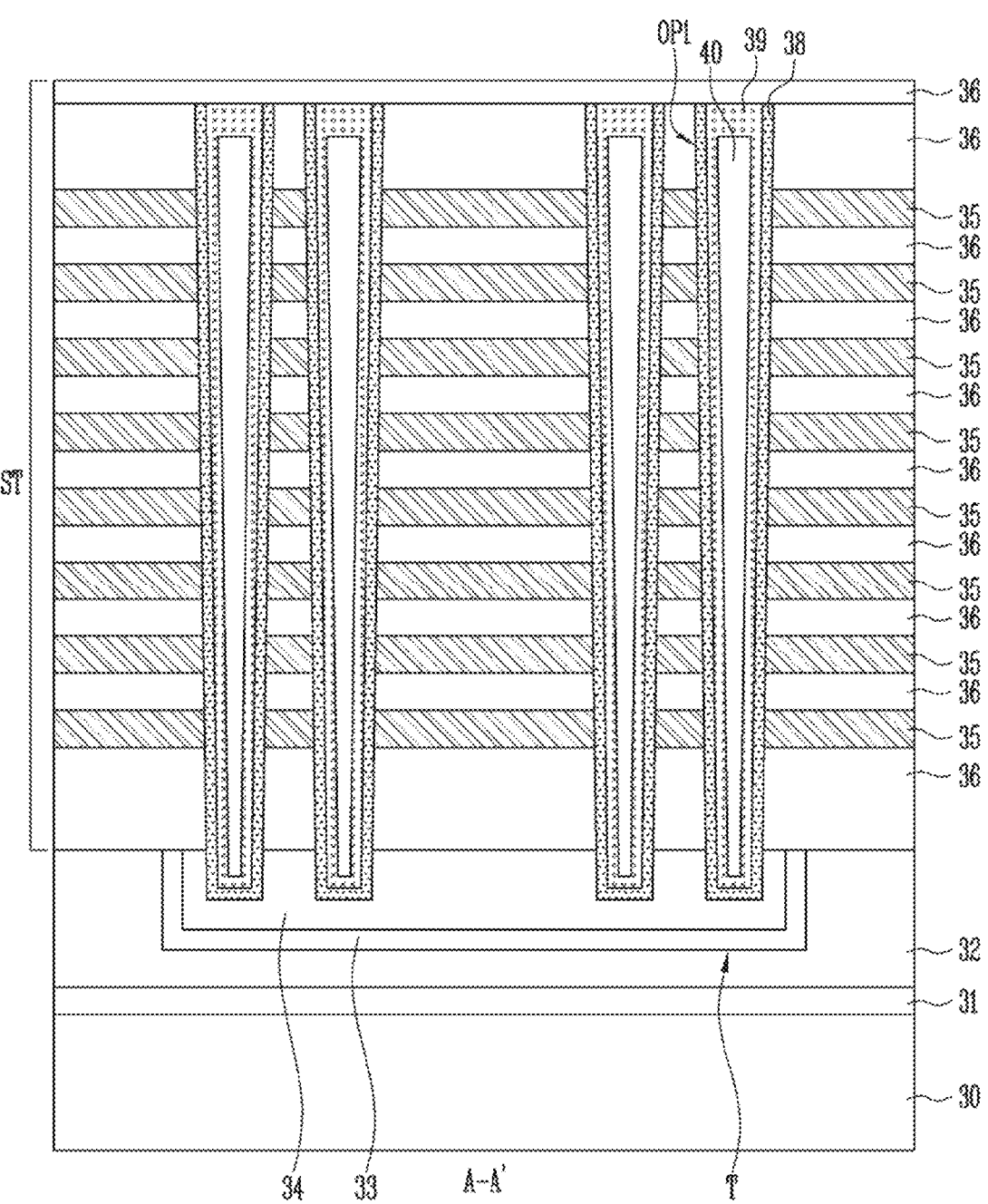

Referring to FIGS. 4A and 4B, an upper structure may be formed on the lower structure to form the structure ST. The upper structure may include the first material layers 35 and the second material layers 36 stacked alternately with each other. At least one uppermost first material layer 35 may be stacked to form a gate electrode of an upper selection transistor, and the other first material layers 35 may be stacked to form gate electrodes of memory cells. In addition, the second material layers 36 may be formed to insulate the stacked gate electrodes from each other. The uppermost second material layer 36 may have a greater thickness than the other second material layers 36.

Subsequently, first openings OP1 may be formed through the structure ST. The first openings OP1 may be located on the trench T in the cell region C, and more particularly, on the first and third line patterns LP1 and LP3. The first openings OP1 may be deep enough to extend to the first sacrificial layer 34 and have various cross-sections such as circular, rectangular, polygonal and elliptical cross-sections.

Subsequently, multilayer dielectric layers 38 may be formed in the first openings OP1. The multilayer dielectric layer 38 may be a memory layer of a memory cell, or a gate insulating layer of a selection transistor. For example, the multilayer dielectric layer 38 may include a tunnel insulating layer, a data storage layer and a charge blocking layer. The data storage layer may include silicon, nitride, nanodots, a phase-change material or the like.

In addition, pillars 39 may be formed in the first openings OP1 in which the multilayer dielectric layers 38 are formed. Gap-filling insulating layers 40 may be formed in open central portions of the pillars 39. The pillars 39 may be arranged in a matrix format at a predetermined distance, or a zigzag pattern. Subsequently, the second material layer 36 may be additionally formed on the structure ST to cover the multilayer dielectric layer 38 and the pillar 39 exposed on a top surface of the structure ST.

Figure 5A:
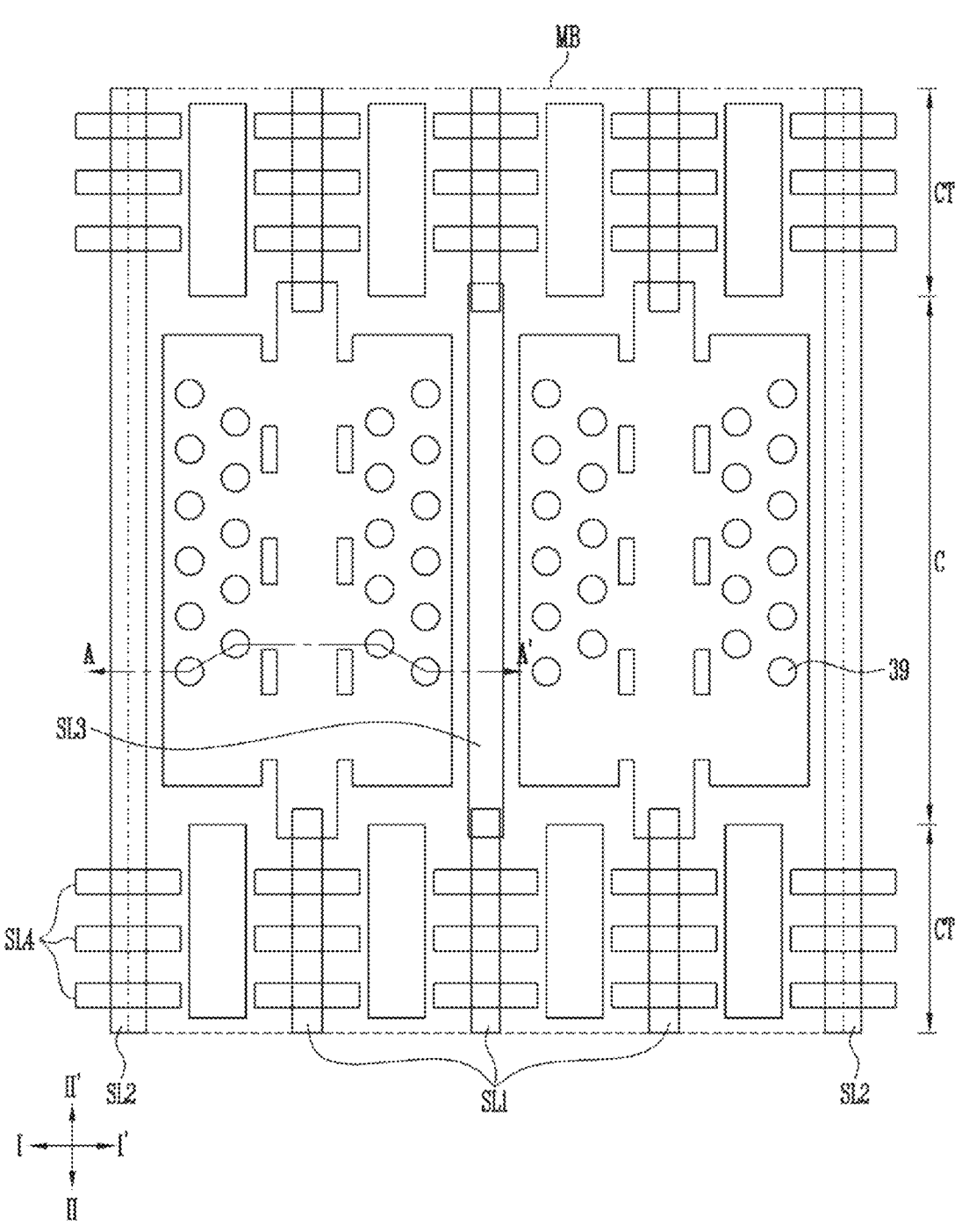
Figure 5B:
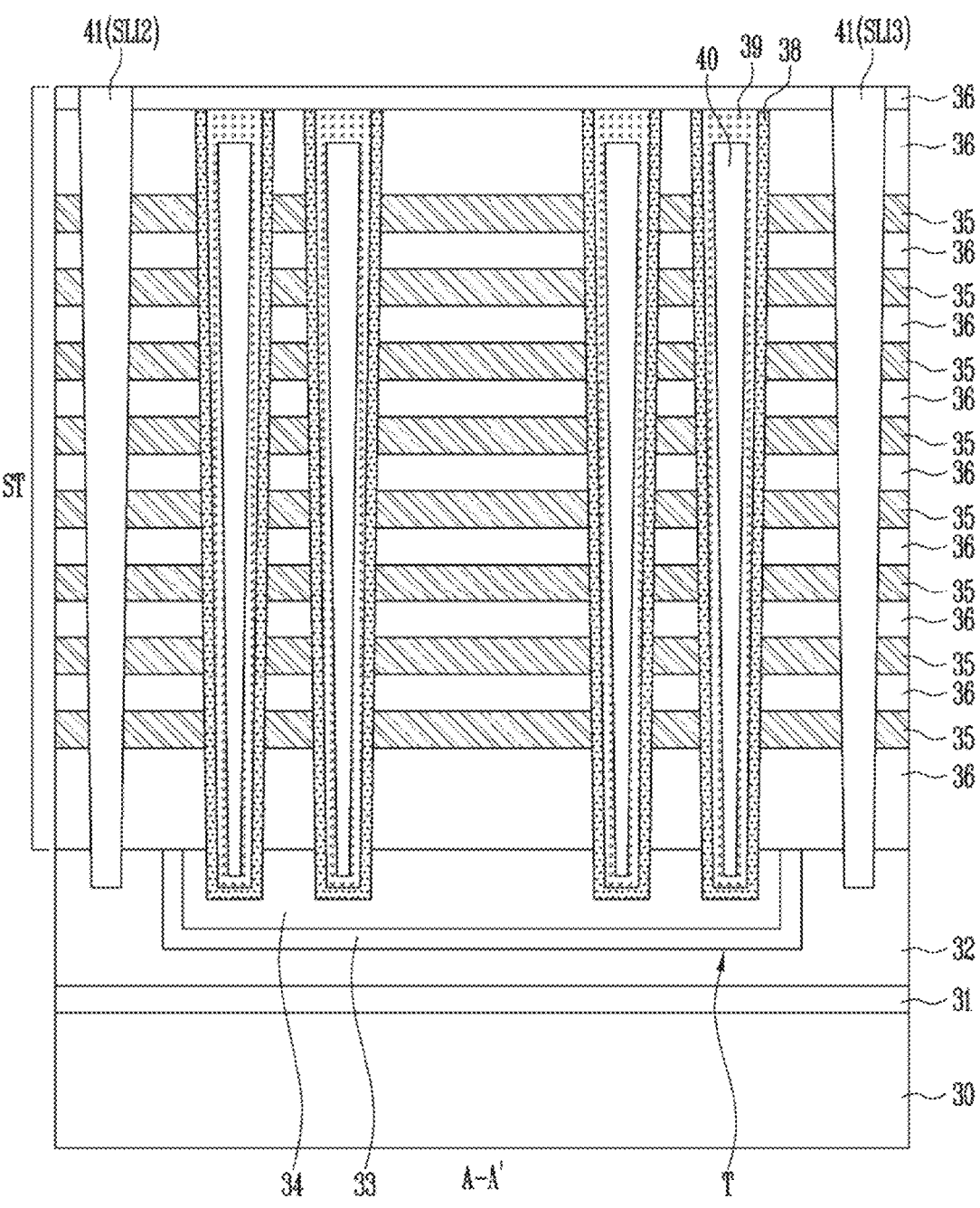

Referring to FIGS. 5A and 5B, at least one of the second, third and fourth slits SL2, SL3 and SL4 may be formed. The second slit SL2 may be formed at the boundary between neighboring memory blocks MB, the third slit SL3 may be located between neighboring trenches T in the cell region C, and the fourth slit SL4 may be located in the contact region CT. Subsequently, third insulating layers 41 may be formed in the second to fourth slits SL2 to SL4. The third insulating layers 41 may function as a support body during subsequent processes of removing the first material layers 35.

The second slit SL2 may separate the structures ST of the neighboring memory blocks MB, may be located in the cell region C and the contact region CT, and have a linear shape extending in the second direction II-II'. The second slit SL2 may be formed through the structure ST and extend to the first conductive layer 32. In addition, the third insulating layer 41 formed in the second slit SL2 may be a second slit insulating layer.

The third slit SL3 may be deep enough to pass through the structure ST and extend to the first conductive layer 32. The third slit SL3 may have a linear shape extending in the second direction II-II' and overlap with the first slit SL1. In addition, the third insulating layer 41 formed in the third slit SL3 may be a third slit insulating layer and be coupled to the first slit insulating layer formed in the first slit SL1. Therefore, the upper portion of the structure ST may be patterned by the third slit insulating layer only in the cell region C, while the lower portion of the structure ST may be patterned by the first slit insulating layer and the third slit insulating layer in the cell region C and the contact region CT.

The fourth slits SL4 may be located in the contact region CT and be deep enough to pass through the structure ST. The fourth slit SL4 may extend in a first direction I-I' to cross the first or second slit SL1 or SL2, and have various shapes, such as a linear shape or an island shape. The third insulating layer 41 formed in the fourth slit SL4 may be a fourth slit insulating layer.

Figure 6A:
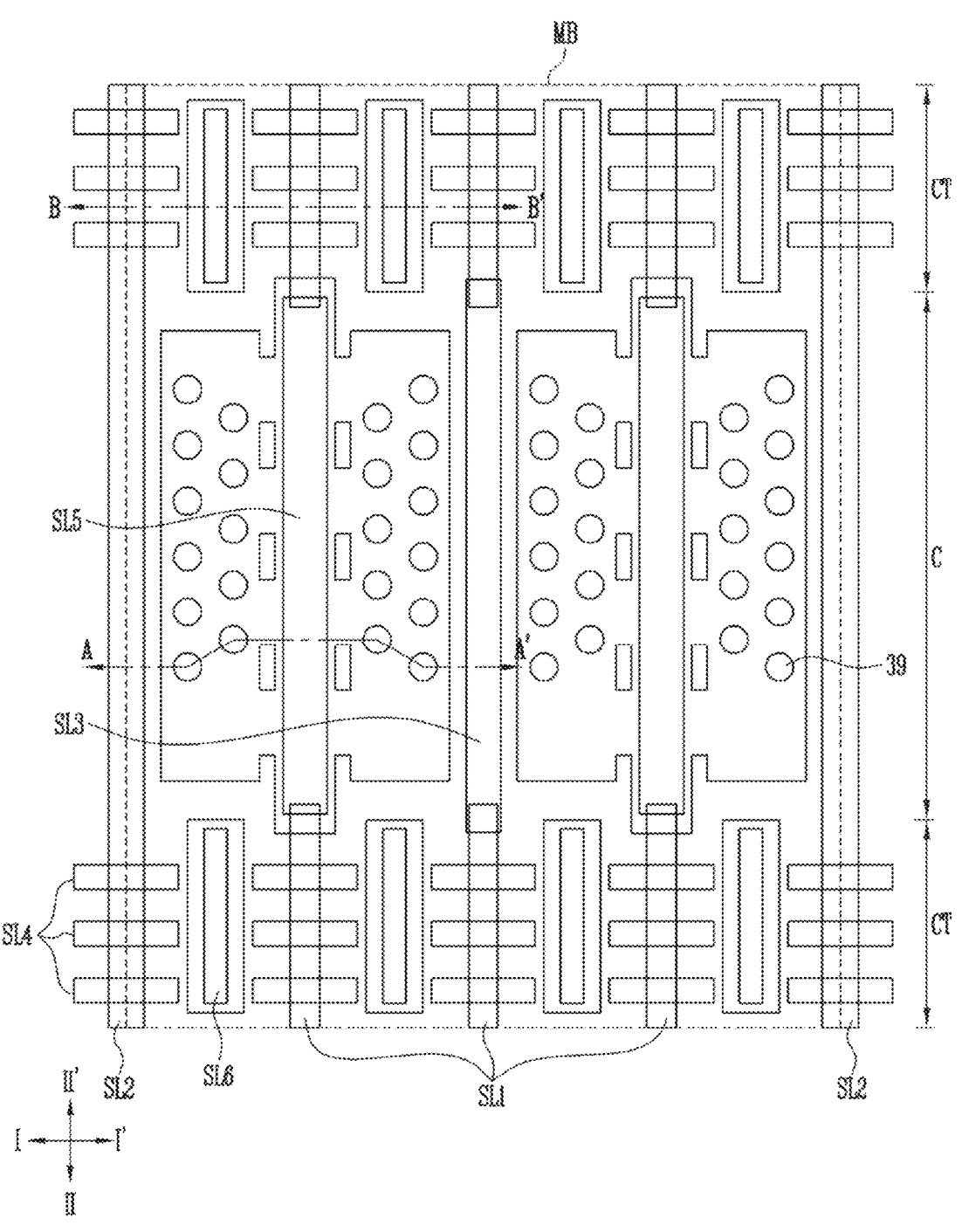
Figure 6B:
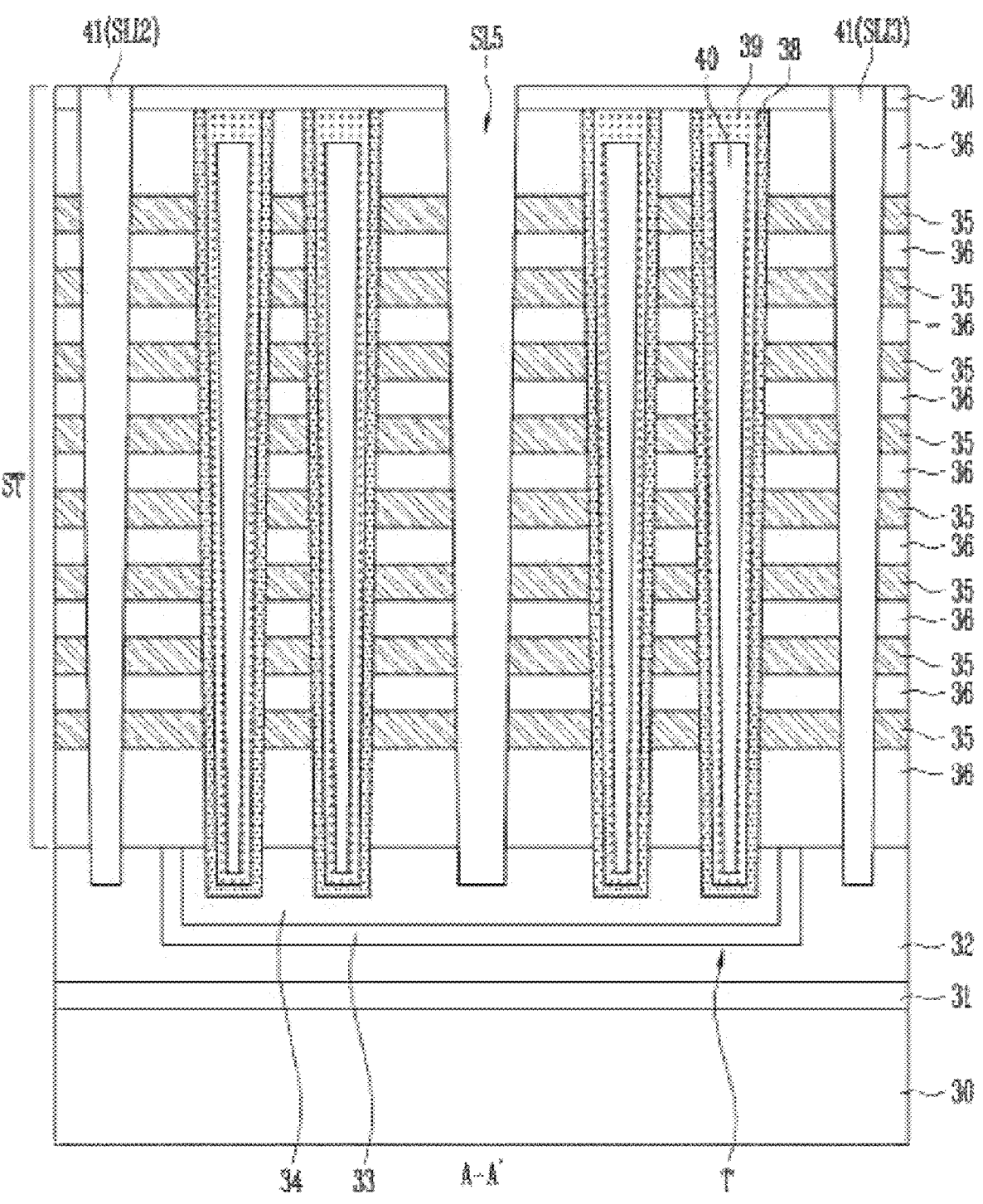
Figure 6C:
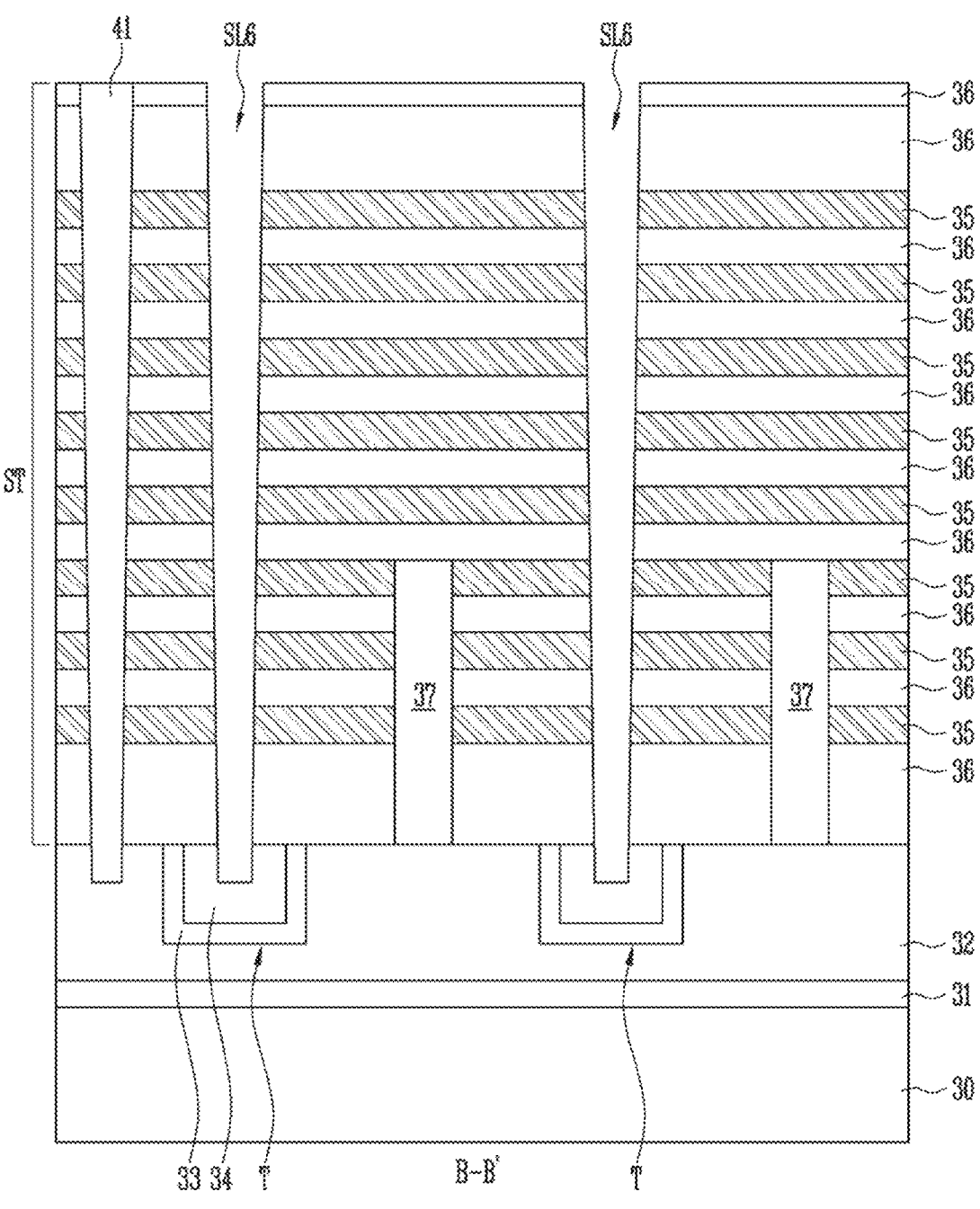

Referring to FIGS. 6A to 6C, fifth slits SL5 and sixth slits SL6 may be formed in the cell region C and the contact region CT, respectively.

The fifth slits SL5 may be deep enough to pass through the structure ST. The fifth slits SL5 may be located on the trench T in the cell region C, and more particularly, on the second line pattern LP2, and extend to the first sacrificial layer 34. The fifth slit SL5 may have a width less than or equal to the second line pattern LP2. In addition, the fifth slit SL5 may have a length less than or equal to the second line pattern LP2. The fifth slit SL5 may partially overlap the first slit SL1. Therefore, when the fifth slit SL5 is formed, the first slit insulating layer within the first slit SL1 may be partially etched, and a first slit insulating layer may be exposed through the fifth slit SL5.

The sixth slit SL6 may be deep enough to pass through the structure ST. The sixth slit SL6 may be located on the trench T in the contact region CT and extend to the first sacrificial layer 34. The sixth slit SL6 may have a width less than or equal to that of the trench T. In addition, the sixth slit SL6 may have a length less than or equal to the trench T.

Figure 7A:
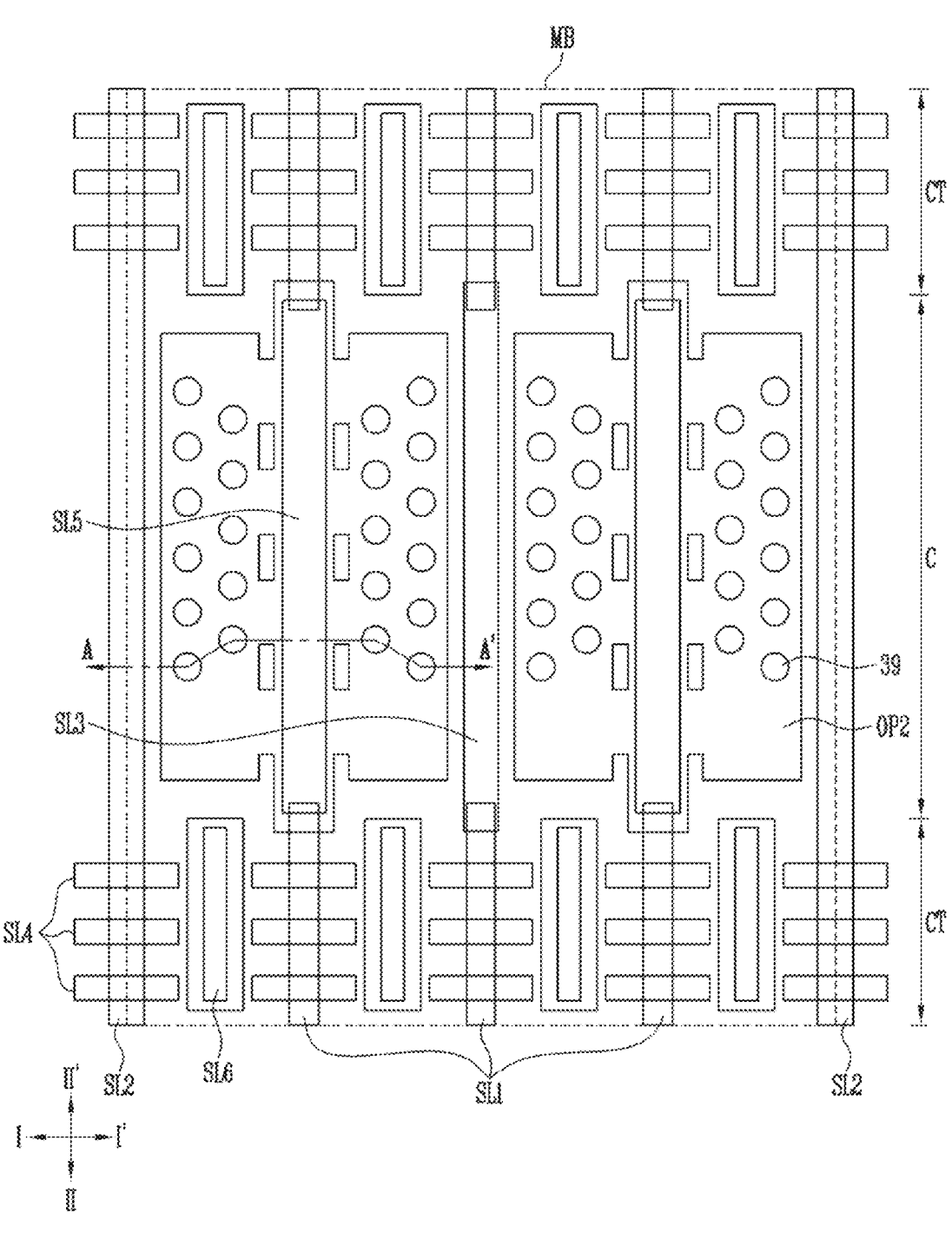
Figure 7B:
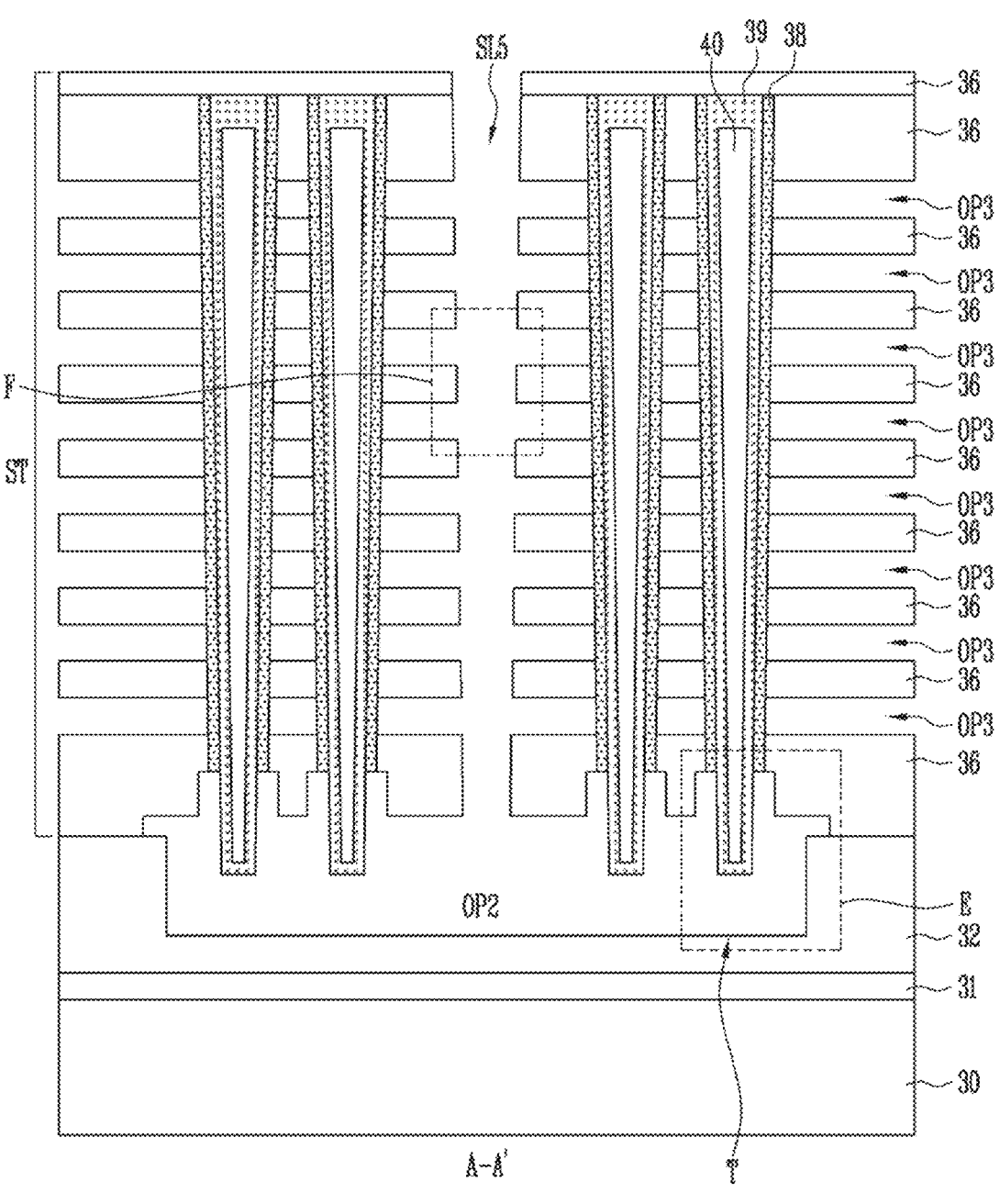

Referring to FIGS. 7A and 7B, the first sacrificial layer 34 and the second sacrificial layer 33 exposed through the fifth slit SL5 may be removed to form second openings OP2. As a result, the multilayer dielectric layer 38 may be partially exposed in the second opening OP2. Subsequently, the multilayer dielectric layer 38 exposed through the second opening OP2 and the first material layers 35 exposed through the fifth and sixth slits SL5 and SL6 may be removed. Third openings OP3 may be formed in regions from which the first material layers 35 are removed. In addition, a lower portion of the pillar 39 may be exposed through the second opening OP2, and the multilayer dielectric layer 38 may be exposed through the third opening OP3.

Figure 8A:
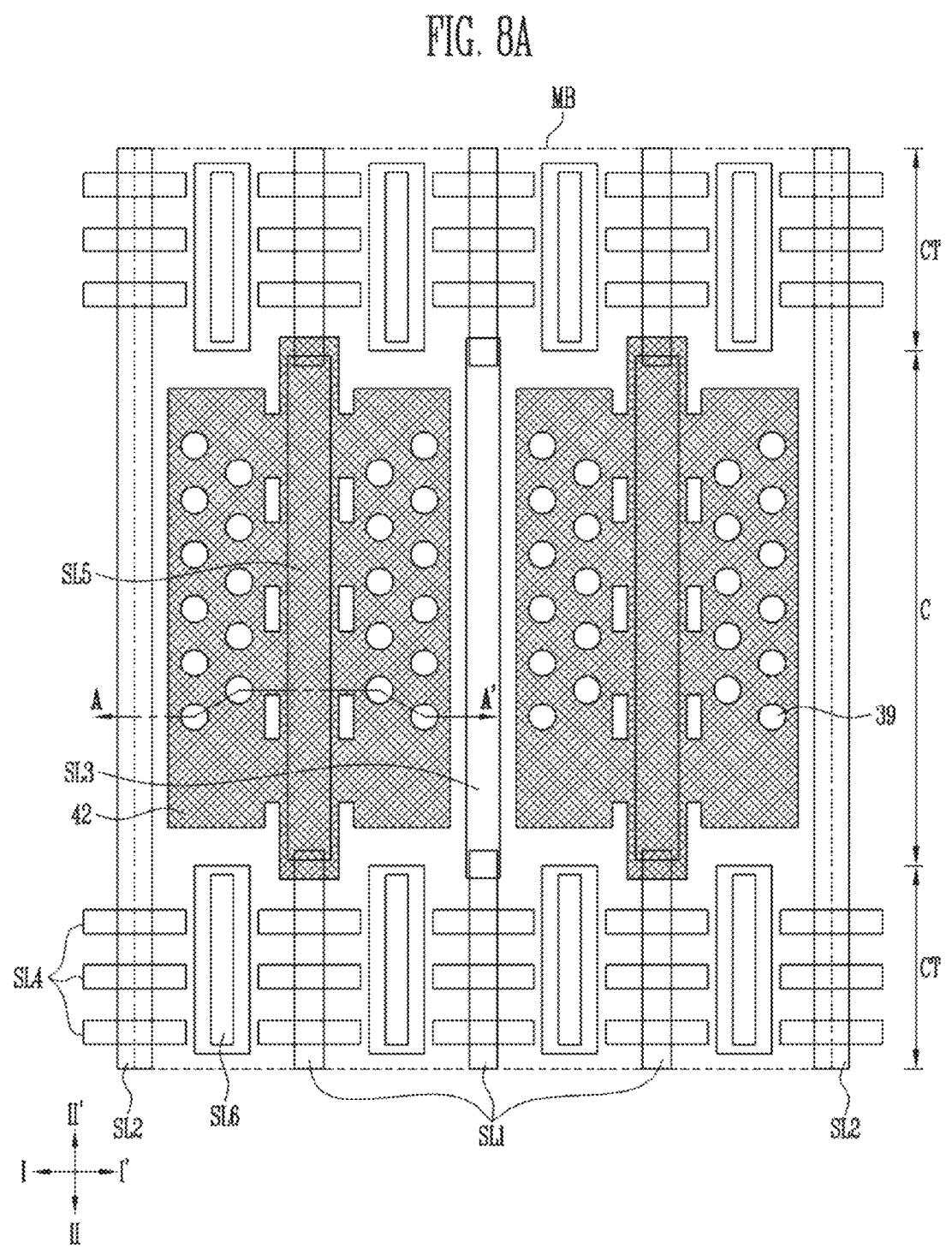
Figure 8B:
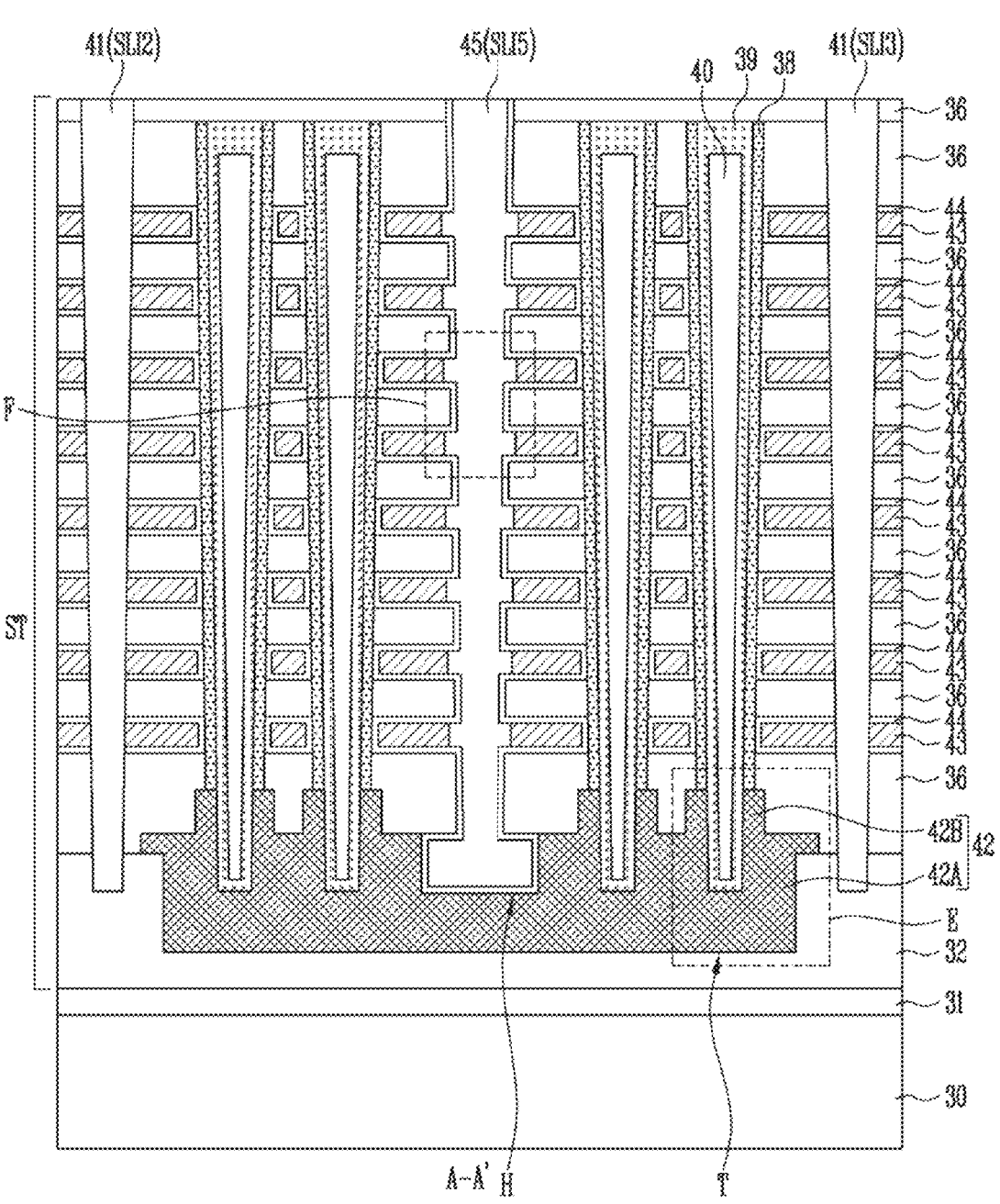

Referring to FIGS. 8A and 8B, second conductive layers 42 may be formed in the second openings OP2. The second conductive layer 42 may include a base portion 42A formed in the trench T and protruding portions 42B protruding from the base portion 42A. The second conductive layer 42 may be a second source layer.

In addition, third conductive layers 43 may be formed in the third openings OP3. The third conductive layers 43 may be gate electrodes of memory cells or selection transistors. Dielectric layers 44 may be formed before the third conductive layers 43 are formed. The dielectric layers 44 may be charge blocking layers.

Subsequently, fourth insulating layers 45 may be formed in the fifth and sixth slits SL5 and SL6. The fourth insulating layer 45 formed in the fifth slit SL5 may be a fifth slit insulating layer, and the fourth insulating layer 45 formed in the sixth slit SL6 may be a sixth slit insulating layer.

Since the fifth slit insulating layer is coupled to the first slit insulating layer, the lower portion of the structure ST may be patterned by the first and fifth slit insulating layer in the cell region C and the contact region CT. The upper portion of the structure ST may be patterned by the fifth slit insulating layer only in the cell region C. Therefore, the third conductive layers 43 included in the lower structure ST may be patterned into a linear shape by the first slit insulating layer, the third slit insulating layer and the fifth slit insulating layer. On the other hand, the third conductive layers 43 included in the upper structure ST may be patterned only in the cell region C. Therefore, different bias may be applied to the third conductive layer 43 located on the left side of the fifth slit or third slit and the third conductive layer 43 located on the right side thereof, among the third conductive layers 43 included in the lower structure ST. On the other hand, the same bias may be applied to the third conductive layer 43 located on the left side of the fifth slit or third slit and the third conductive layer 43 located on the right side thereof, among the third conductive layers 43 included in the upper structure ST.

Figure 9A:
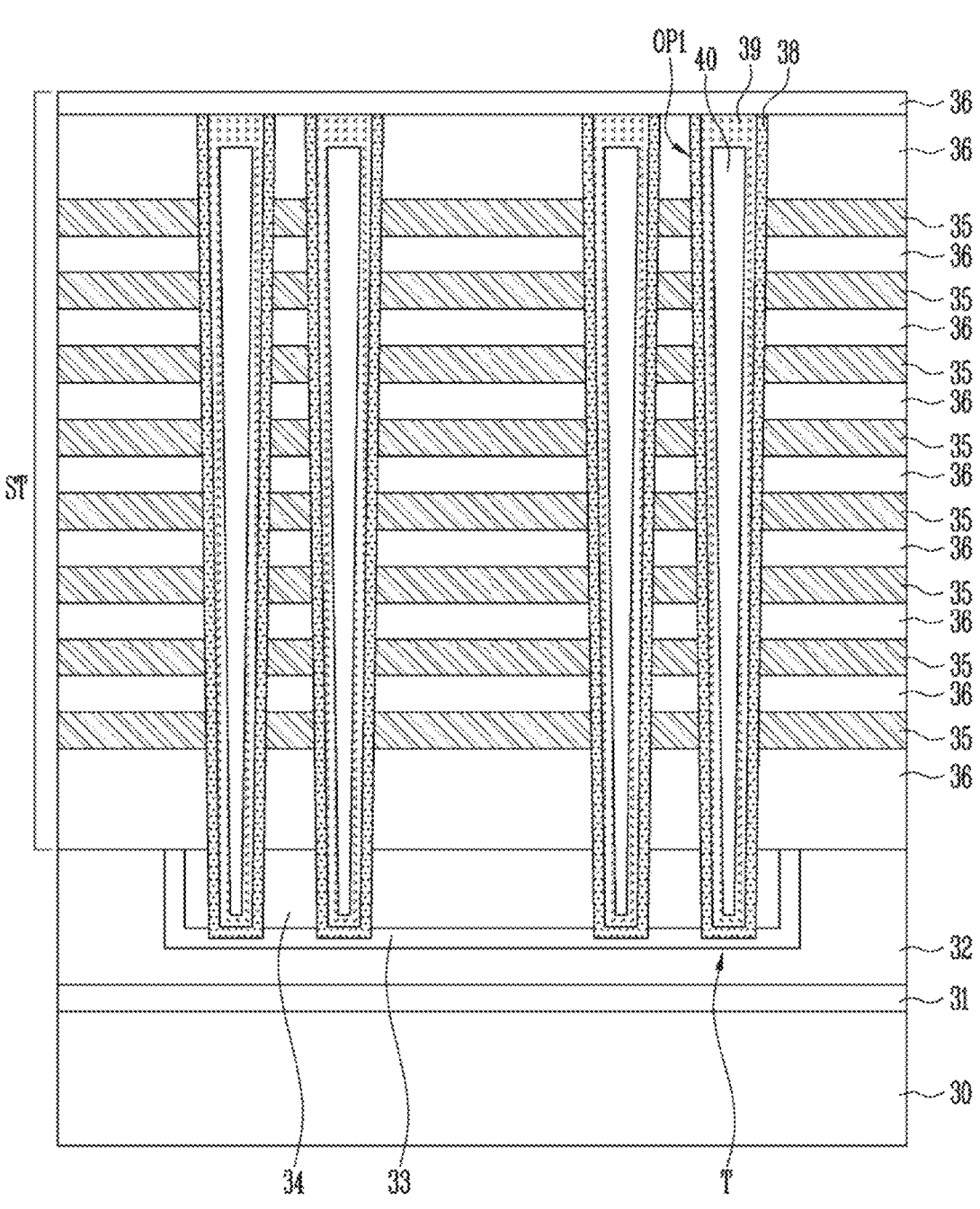
FIGS. 9A and 9B are cross-sectional views illustrating a method of manufacturing an electronic device according to a modified embodiment.
Figure 9B:
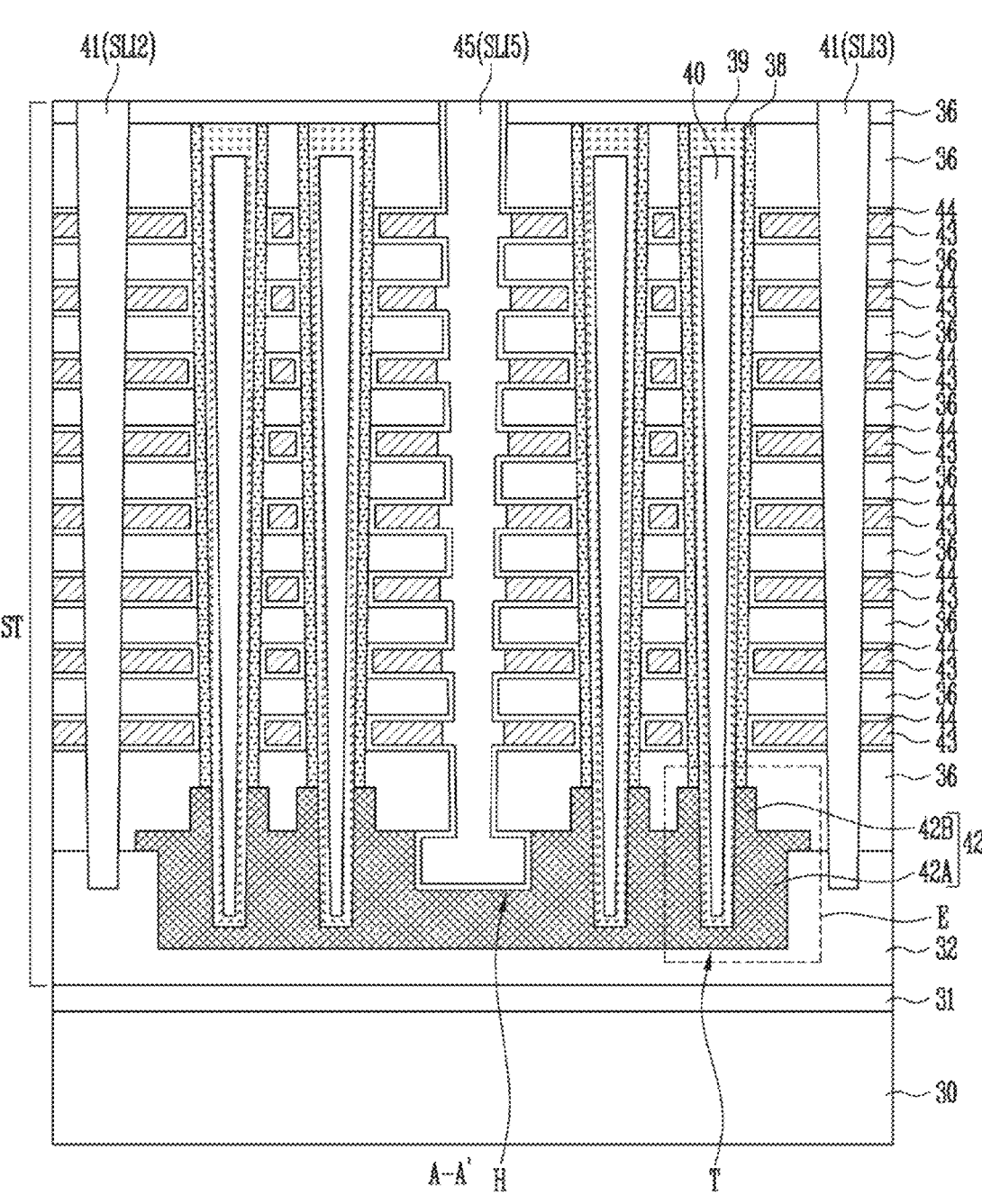

FIGS. 9A and 9B are cross-sectional views illustrating a method of manufacturing an electronic device according to a modified embodiment. FIG. 9A corresponds to FIG. 4B, and FIG. 9B corresponds to FIG. 8B. Hereinafter, a description of common contents with earlier described embodiments is omitted.

Referring to FIG. 9A, the first opening OP1 may be deep enough to extend to the second sacrificial layer 33. Therefore, the multilayer dielectric layer 38 and the pillar 39 may also be deep enough to extend to the second sacrificial layer 33. In addition, the first opening OP1 may pass through the trench T and extend to the first conductive layer 32. In addition, referring to FIG. 9B, the pillars 39 may be recessed into the second conductive layer 42 deeper than those in the embodiment described above with reference to FIG. 8B.

Figure 10A:
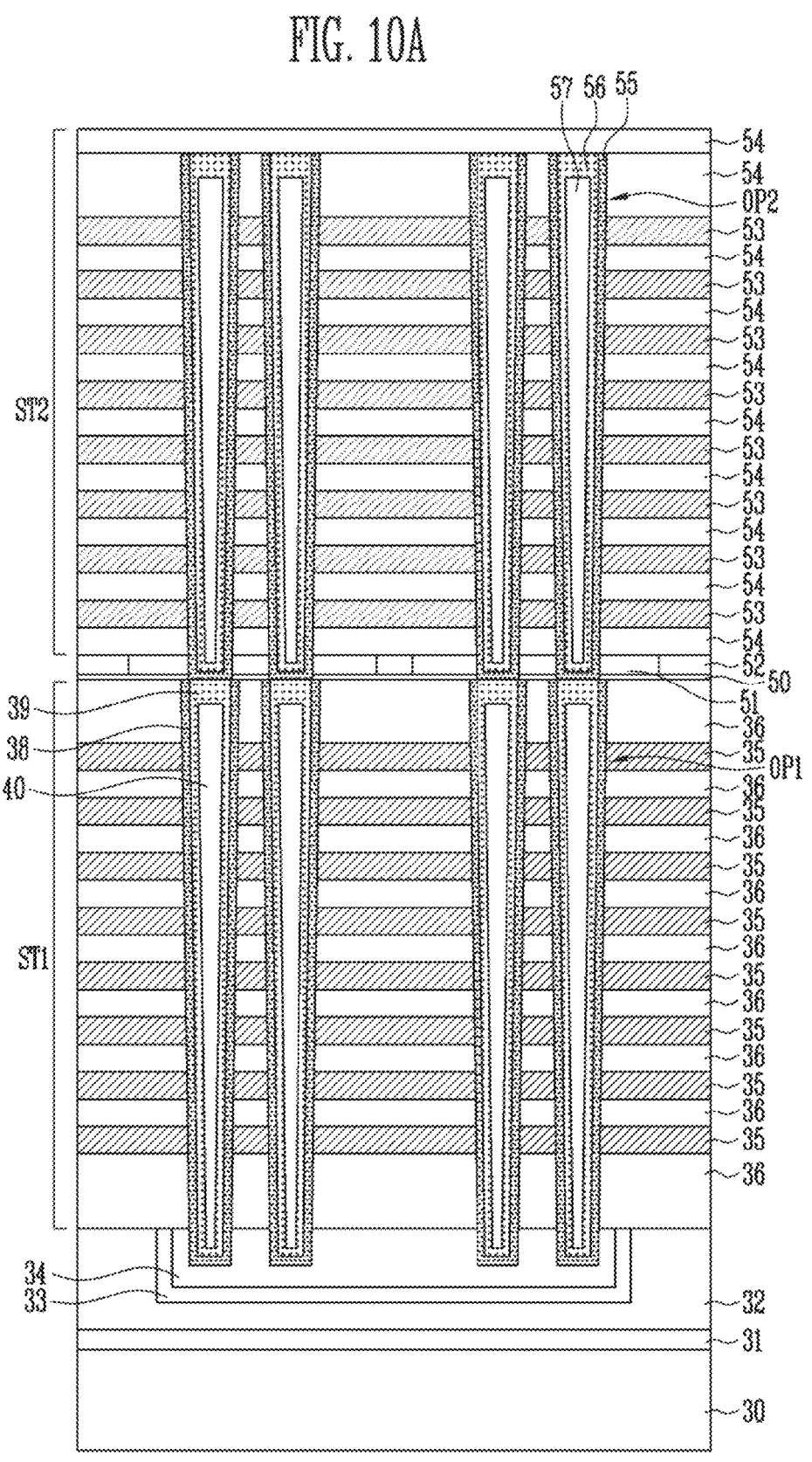
FIGS. 10A to 10C are cross-sectional views illustrating a method of manufacturing an electronic device according to a modified embodiment.
Figure 10B:
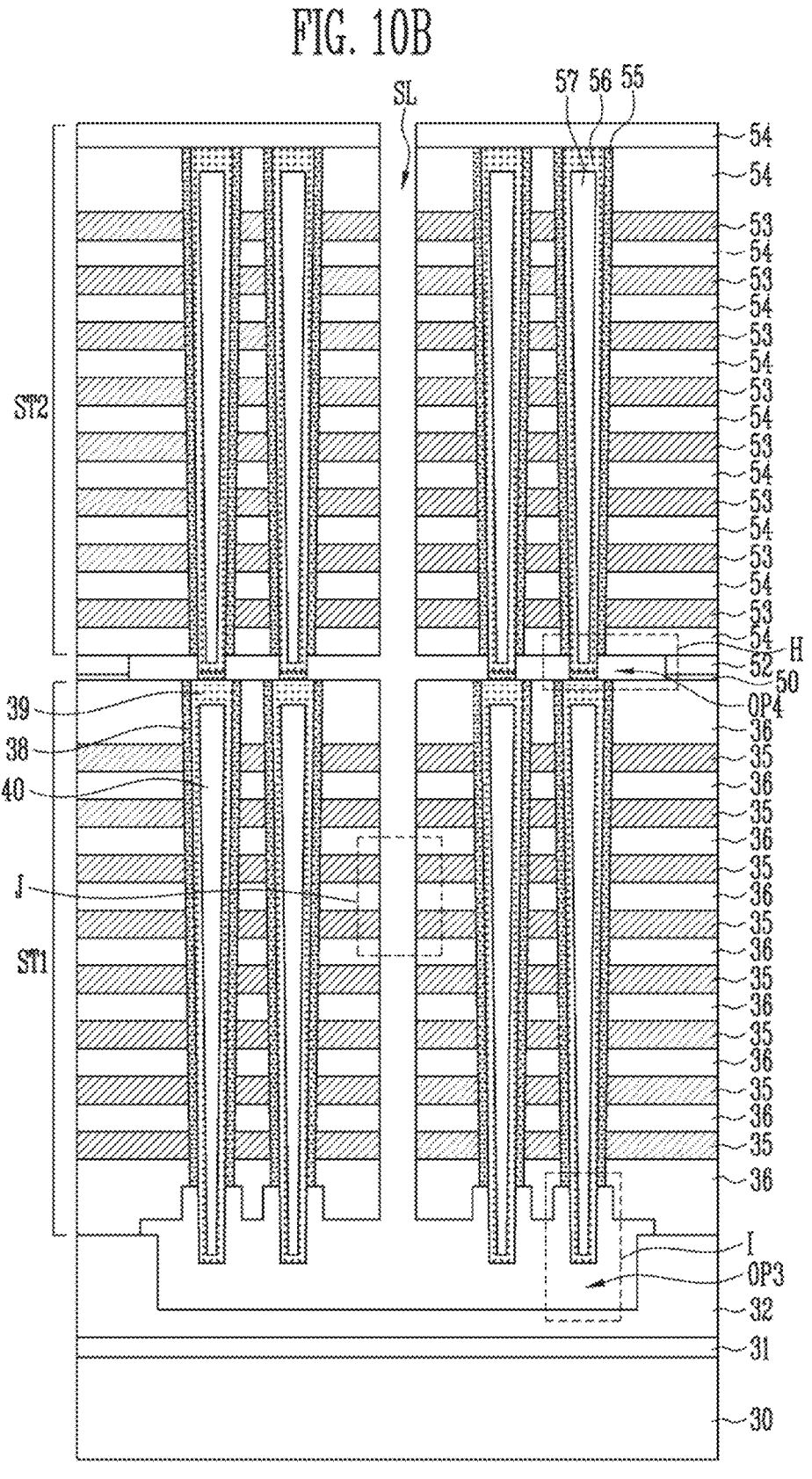
Figure 10C:
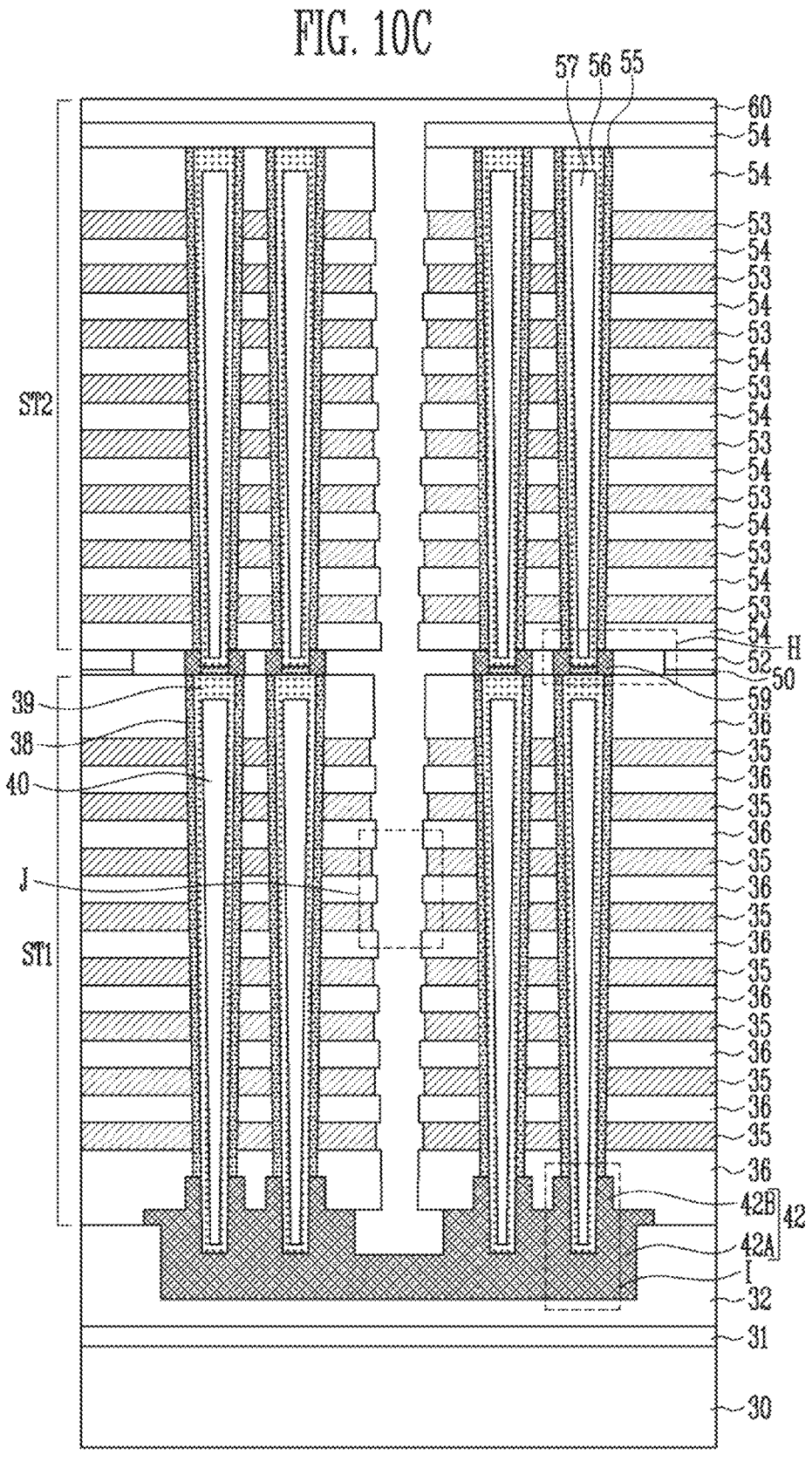

FIGS. 10A to 10C are cross-sectional views illustrating a method for manufacturing an electronic device according to an embodiment. Hereinafter, a description of common contents with earlier described embodiments is omitted.

Referring to FIG. 10A, the first insulating layer 31, the first conductive layer 32, the first sacrificial layer 34 and the second sacrificial layer 33 may be formed over the substrate 30. Subsequently, the first structure ST1 including the first material layers 35 and the second material layers 36 stacked alternately with each other may be formed thereon. The first material layers 35 are conductive layers and the second material layers 36 are insulating layers.

After the first openings OP1 are formed through the first structure ST1, the first multilayer dielectric layers 38, the first pillars 39 and the first gap-filling insulating layers 40 may be formed in the first openings OP1.

Subsequently, a third sacrificial layer 50 and a fourth sacrificial layer 51 may be sequentially formed on the first structure ST1. The fourth sacrificial layer 51 may be formed to ensure spaces in which coupling patterns are formed to couple the first pillars 39 and second pillars to be formed. The fourth sacrificial layer 51 may overlap with at least one first pillar 39. For example, the third sacrificial layer 50 may include an oxide, and the fourth sacrificial layer 51 may include polysilicon.

The fourth sacrificial layer 51 may be formed in the second insulating layer 52. For example, after the second insulating layer 52 is formed on the third sacrificial layer 50, the second insulating layer 52 may be partially etched to form a trench. Subsequently, the fourth sacrificial layer 51 may be formed in the trench. Another second insulating layer 52 may be additionally formed to cover the fourth sacrificial layer 51 and the previously formed second insulating layer 52. In another example, after the third sacrificial layer 50 is formed on the first structure ST1, the fourth sacrificial layer 51 having a desired pattern may be formed on the third sacrificial layer 50. Subsequently, the second insulating layer 52 may be formed on the third sacrificial layer 50 on which the fourth sacrificial layer 51 is formed.

Subsequently, the second structure ST2 including first material layers 53 and second material layers 54 stacked alternately with each other may be formed on the second insulating layer 52. The first material layers 53 may include conductive layers, and the second material layers 54 may include insulating layers.

Subsequently, after the second openings OP2 are formed through the second structure ST2, second multilayer dielectric layers 55, second pillars 56 and second gap-filling insulating layers 57 may be formed in the second openings OP2. The second openings OP2 may be deep enough to partially etch the first pillars 39 so that upper portions of the first pillars 39 and lower portions of the second pillars 56 may overlap with each other. In addition, the second pillars 56 may be formed at positions corresponding to the first pillars 39, respectively.

Referring to FIG. 10B, the slit SL may be formed through the second structure ST2, the second insulating layer 52, the third sacrificial layer 50, the fourth sacrificial layer 51, the first structure ST1 and the first sacrificial layer 34. Subsequently, the first sacrificial layer 34, the second sacrificial layer 33 and the fourth sacrificial layer 51 exposed through the slit SL may be removed to form the third openings OP3 and the fourth openings OP4. As a result, the first multilayer dielectric layer 38 may be partially exposed through the third opening OP3. For example, a lower portion of the first multilayer dielectric layer 38 may be exposed through the third opening OP3. The second multilayer dielectric layer 55 may be partially exposed through the fourth opening OP4. For example, a lower portion of the second multilayer dielectric layer 55 may be exposed through the fourth opening OP4.

Subsequently, the first and second multilayer dielectric layers 38 and 55 exposed through the third and fourth openings OP3 and OP4, respectively, may be removed. As a result, the first pillars 39 may be partially exposed through the third openings OP3. For example, the lower portion of the first pillars 39 may be exposed through the third opening OP3. The second pillars 56 may be partially exposed through the fourth openings OP4. For example, the lower portion of the second pillars 56 may be exposed through the third opening OP4.

Referring to FIG. 10C, the second conductive layer 42 may be formed between the first conductive layer 32 and the first pillars 39 exposed through the third openings OP3. For example, the second conductive layer 42 including silicon may be grown by selective growth. Before the second conductive layer 42 is grown by selective growth, a dry cleaning process may be performed to remove a native oxide layer formed on the first conductive layer 32 and the first pillars 39. After the dry cleaning process is performed, a selective growth process may be directly performed without a vacuum break.

In addition, coupling patterns 59 may be formed between the first pillars 39 and the second pillars 56 exposed through the fourth openings OP4. For example, the coupling patterns 59 may be grown from the first pillars 39, from the second pillars 56, or from both by selective growth. Growth conditions may be controlled so that the neighboring coupling patterns 59 may not be coupled to each other. As a result, the coupling patterns 59 including silicon may be formed. Subsequently, a third insulating layer 60 may be formed in the first opening OP1, the second opening OP2 and the slit SL.

According to the above-described processes, since a pillar having a high aspect ratio is formed using two separate processes, it may be easier to manufacture an electronic device. In addition, the coupling pattern 59 coupling the first pillar 39 and the second pillar 56 may be formed by selective growth after a dry cleaning process is performed, so that contact resistance between the first pillar 39 and the second pillar 56 may be reduced. In addition, since the coupling pattern 59 and the second conductive layer 42 are formed at the same time, manufacturing processes of an electronic device may be simplified.

FIGS. 11A to 11D are layout views illustrating the structure of an electronic device according to a modified embodiment. Hereinafter, a description of common contents with earlier described embodiments is omitted, and the layouts are mainly described.

Figure 11A:
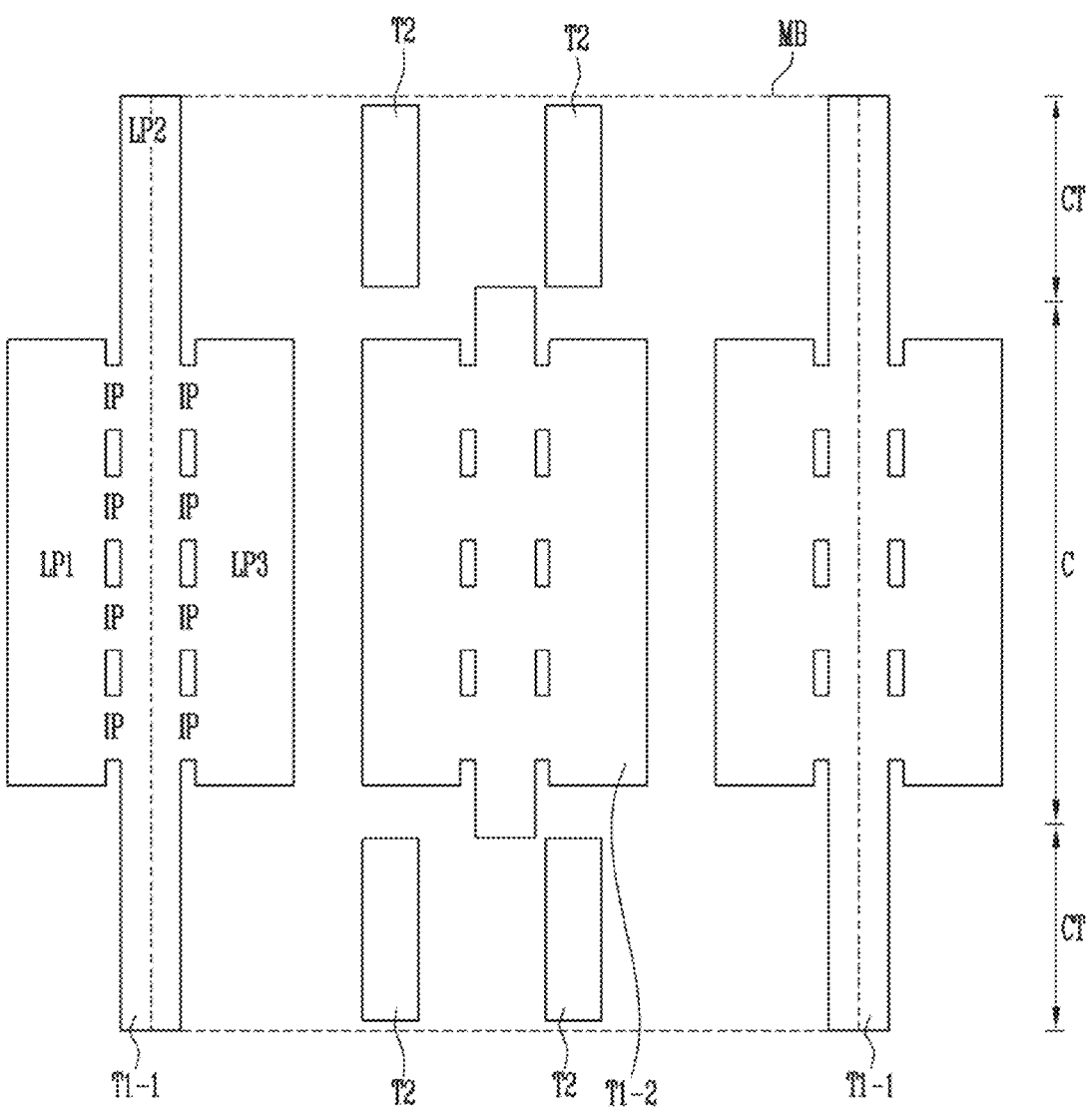
FIGS. 11A to 11D are layout views illustrating the structure of an electronic device according to a modified embodiment.

Referring to FIG. 11A, first trenches T1-1 and T1-2 and second trenches T2 may be formed in the cell region C and the contact region CT. More specifically, the first trenches T1-1 and T1-2 may be located in the memory block MB or at the boundary between neighboring memory blocks MB. In addition, the second trenches T2 may be located in the contact region CT.

Each of the first trenches T1-1 and T1-2 may include the first to third line patterns LP1 to LP3 and island patterns IP coupling the line patterns LP1 to LP3. The first trenches T1-1 and T1-2 may have the same or different shapes, and may include the second line patterns LP2 having different lengths. For example, the second line pattern LP2 of a first type-first trench T1-1 may have a greater length than a second type-first trench T1-2. The second line pattern LP2 of the first type-first trench T1-1 may extend from the cell region C to the contact region CT and separate the first conductive layers 32 of the neighboring memory blocks MB from each other.

Figure 11B:
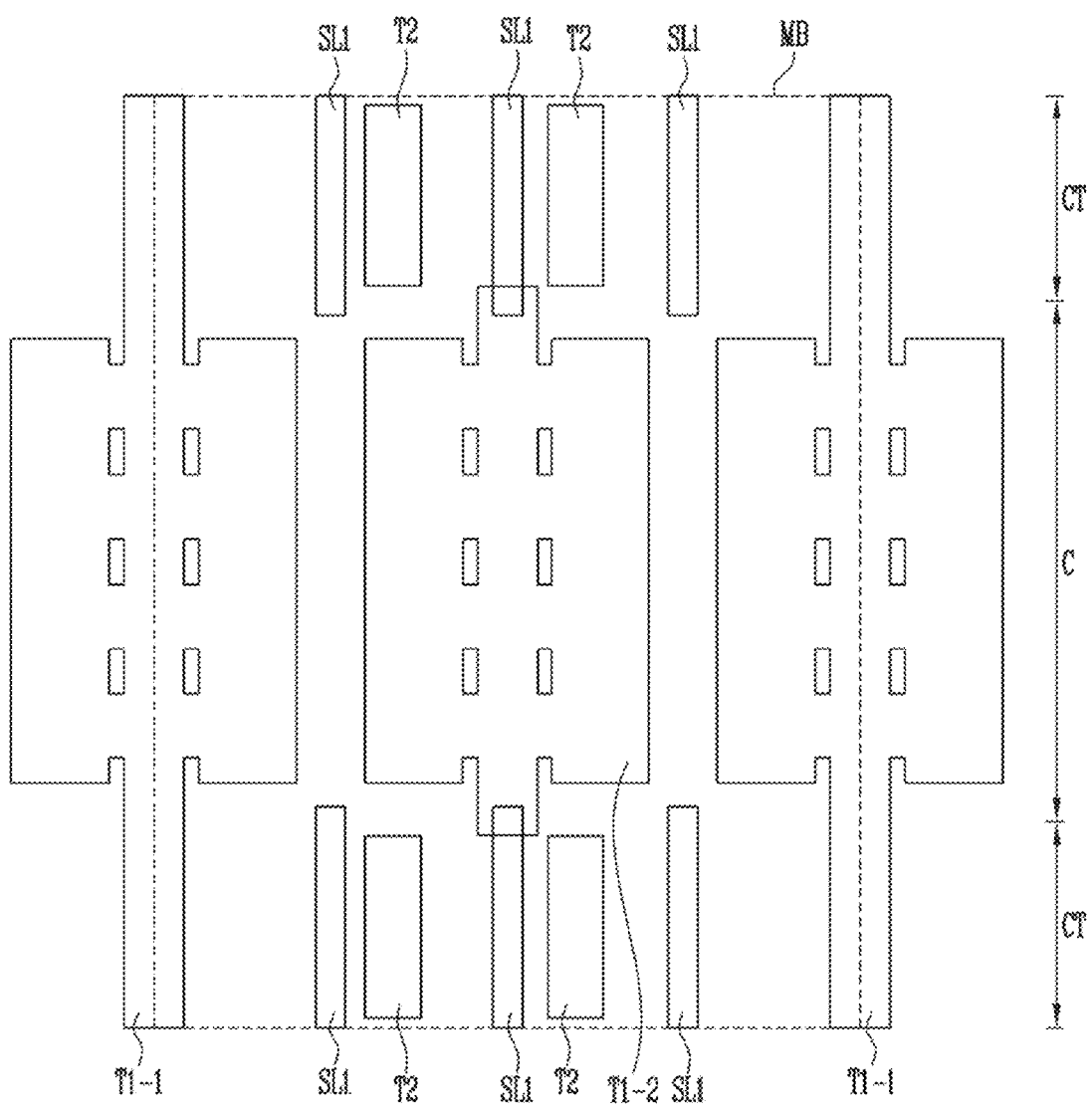

Referring to FIG. 11B, the first slits SL1 may be formed in the contact region CT and pass through the lower structure. The first slits SL1 may be located between the second trenches T2. Some of the first slits SL1 may overlap with the second type-first trench T1-2. For example, a first end of the first slits SL1 may overlap with a first end of the second type-first trench T1-2. First slit insulating layers may be formed in the first slits SL1.

Figure 11C:
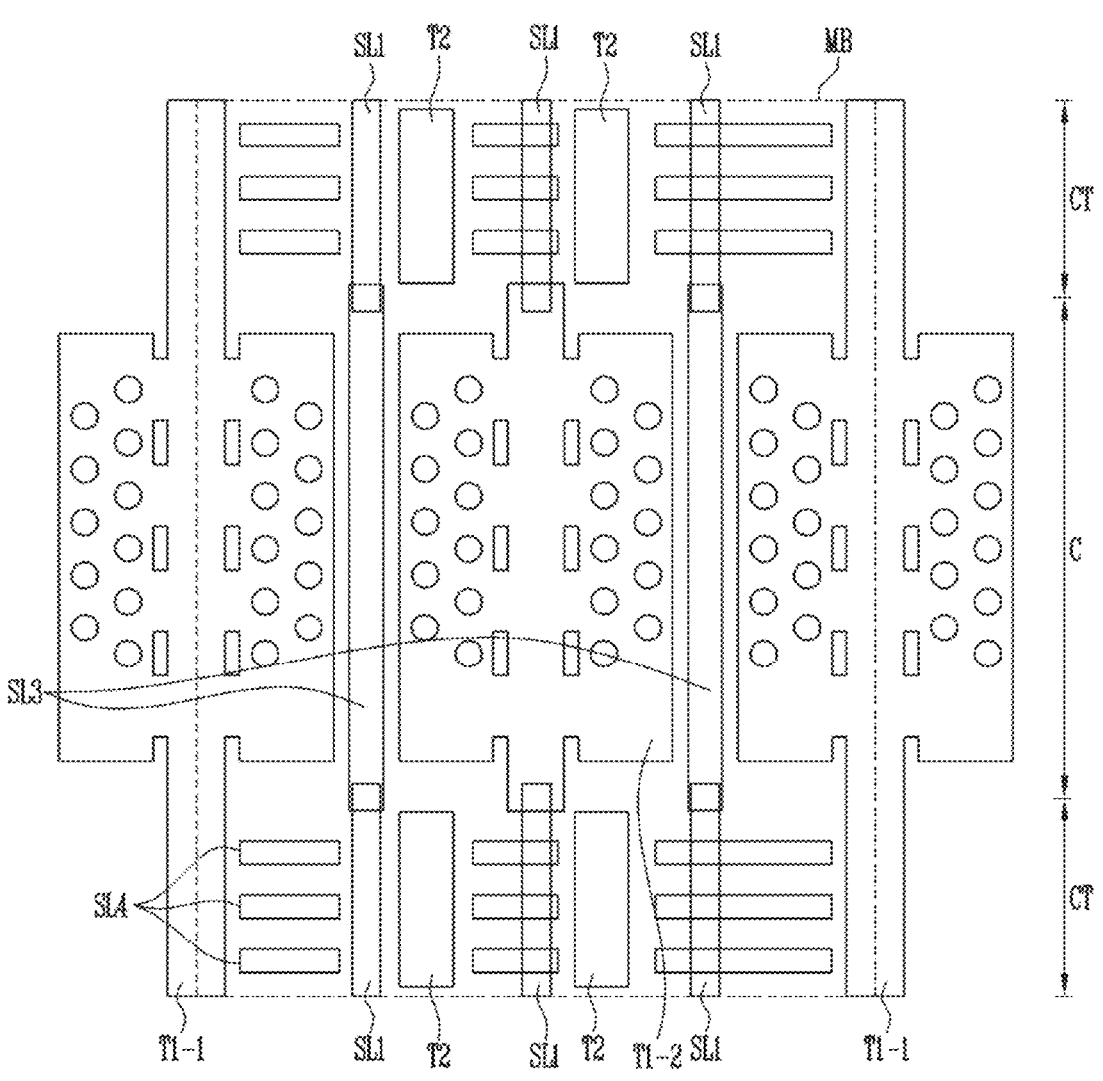

Referring to FIG. 11C, the third slits SL3 may be formed between the neighboring first trenches T1-1 and T1-2 in the cell region C, and the fourth slits SL4 may be formed in the contact region CT.

The third slit SL3 may be deep enough to pass through the structure ST and expose the first slit insulating layer. Therefore, a third slit insulating layer formed in the third slit SL3 may be coupled to the first slit insulating layer.

The fourth slits SL4 may be located between the first and second trenches T1-1, T1-2, and T2 and have the same lengths or different lengths from each other. In addition, some of the fourth slits SL4 may cross the first slit SL1. Fourth slit insulating layers may be formed in each of the fourth slits SL4.

Figure 11D:
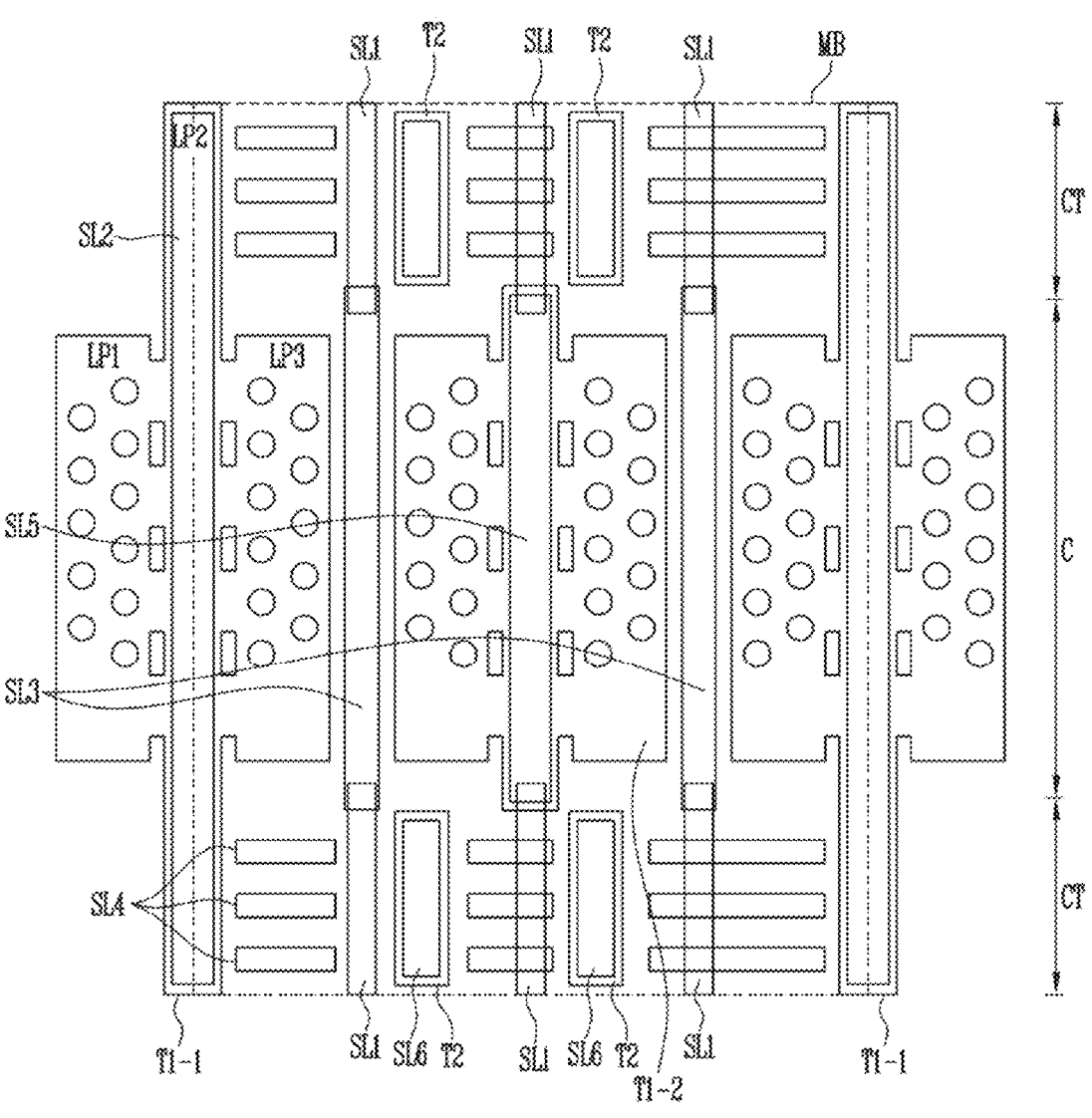

Referring to FIG. 11D, the second slits SL2 may be formed at the boundary between the neighboring memory blocks MB, the fifth slits SL5 may be formed in the cell region C, and the sixth slits SL6 may be formed in contact region CT.

The second slit SL2 may be deep enough to pass through the structure ST and be formed on the second line pattern LP2 of the first type-first trench T1-1. The second slit SL2 may have a smaller width and length than the second line pattern LP2.

The fifth slit SL5 may be deep enough to pass through the structure ST and be located on the second line pattern LP2 of the second type-first trench T1-2. In addition, the fifth slit SL5 may overlap with the first slit SL1.

The sixth slits SL6 may be located on the second trenches T2 and have a smaller width and length than the second trench T2.

According to the above-described layout, the first and second sacrificial layers 34 and 33 may be replaced with the second conductive layer 42, and the first material layers 35 may be replaced with the third conductive layers 43, through the second, fifth and sixth slit SL2, SL5, and SL6. In addition, second, fifth and sixth slit insulating layers may be formed in the second, fifth and sixth slits SL2, SL5, and SL6, and the fifth slit insulating layer may be coupled to the first slit insulating layer. The shapes, arrangements and formation order of the slits may vary.

FIGS. 12A to 16A and FIGS. 12B to 16B are views illustrating a method of manufacturing an electronic device according to an embodiment. More specifically, FIGS. 12A to 16A are enlarged views of the region E shown in FIGS. 7B and 8B, and FIGS. 12B to 16B are enlarged views of the region F shown in FIGS. 7B and 8B.

Figure 12A:
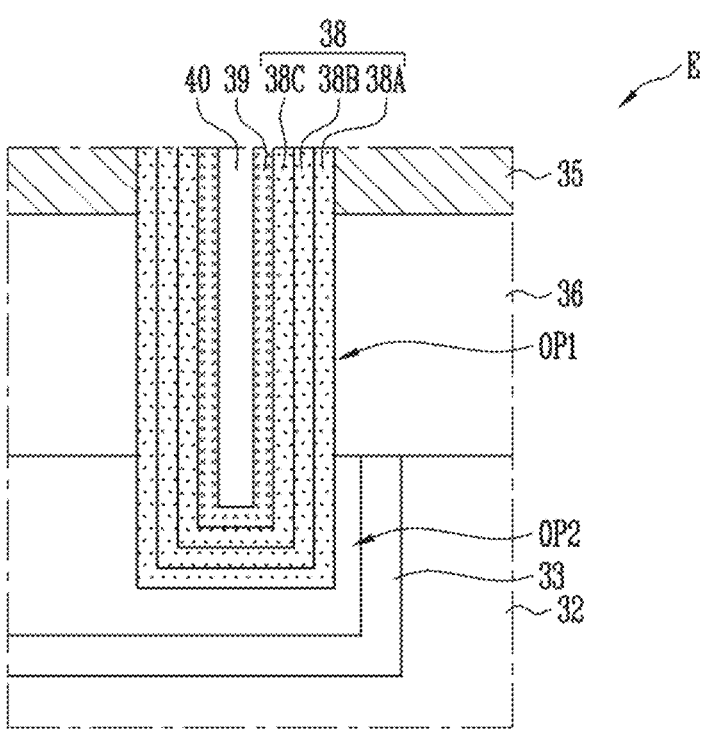
Figure 12B:
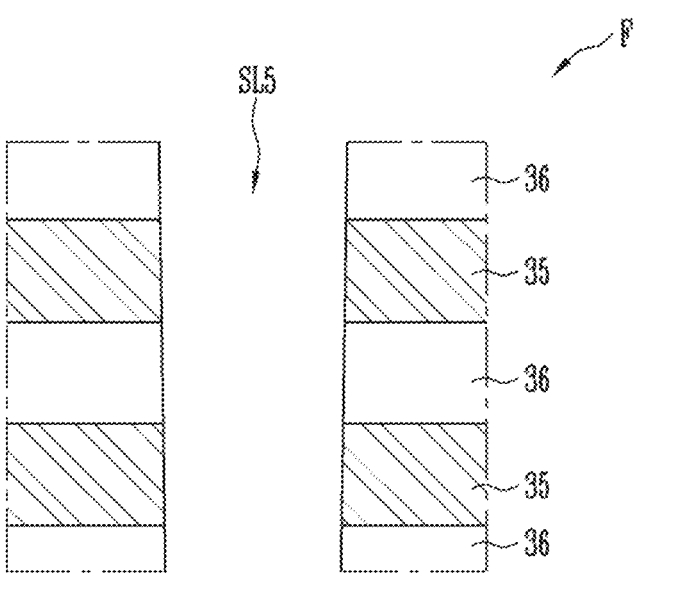

Referring to FIGS. 12A and 12B, the multilayer dielectric layer 38 may include a first dielectric layer 38A, a second dielectric layer 38B and a third dielectric layer 38C. The first dielectric layer 38A may be formed along an inner surface of the first opening OP1. The second dielectric layer 38B may be formed on the first dielectric layer 38A and have a high etch selectivity with respect to the first dielectric layer 38A. The third dielectric layer 38C may be formed on the second dielectric layer 38B and have a high etch selectivity with respect to the second dielectric layer 38B. For convenience of description, the first, second and third dielectric layers may be referred to as a charge blocking layer 38A, a data storage layer 38B and a tunnel insulating layer 38C, respectively, according to functions thereof.

After the charge blocking layer 38A, the data storage layer 38B and the tunnel insulating layer 38C are sequentially formed in the first opening OP1, the pillar 39 and the gap-filling insulating layer 40 may be formed therein. Subsequently, the first sacrificial layer 34 may be removed through the fifth slit SL5 to form the second opening OP2. As a result, the charge blocking layer 38A may be exposed through the second opening OP2.

Figure 13A:
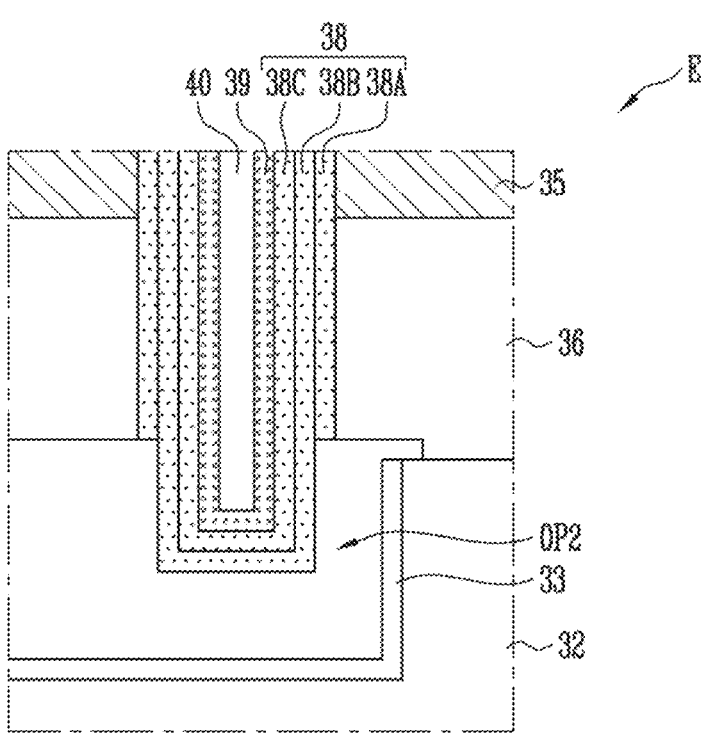
Figure 13B:
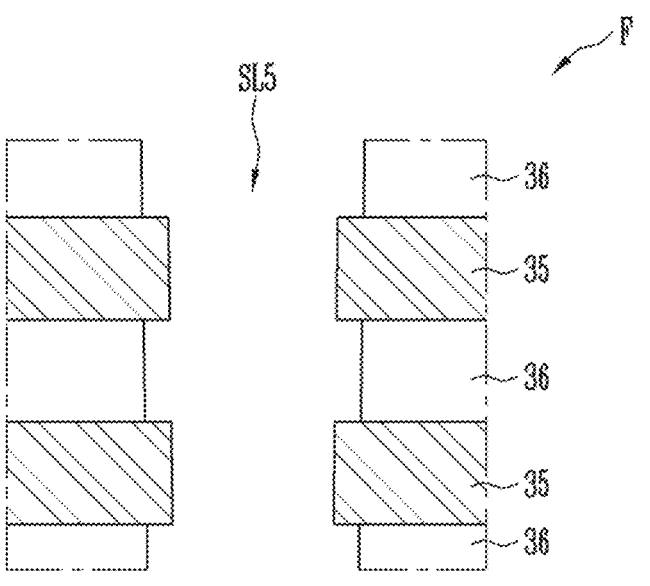

Referring to FIGS. 13A and 13B, the charge blocking layer 38A exposed through the second opening OP2 may be removed, so that the data storage layer 38B may be exposed through the second opening OP2. When the charge blocking layer 38A and the second material layers 36 include oxides, the second material layers 36 exposed through the fifth slit SL5 may be etched to a predetermined thickness during an etching process of the charge blocking layer 38A. The first material layers 35 may protrude further than the second material layers 36. As a result, irregularities may be formed on inner walls of the second slit SL2, the fifth slit SL5 and the sixth slit SL6.

In addition, when the charge blocking layer 38A, the second material layers 36 and the second sacrificial layer 33 include oxides, the second sacrificial layer 33 and the second material layer 36 exposed through the second opening OP2 may be etched to a predetermined thickness during the etching process of the charge blocking layer 38A. Therefore, the second opening OP2 may be extended.

Figure 14A:
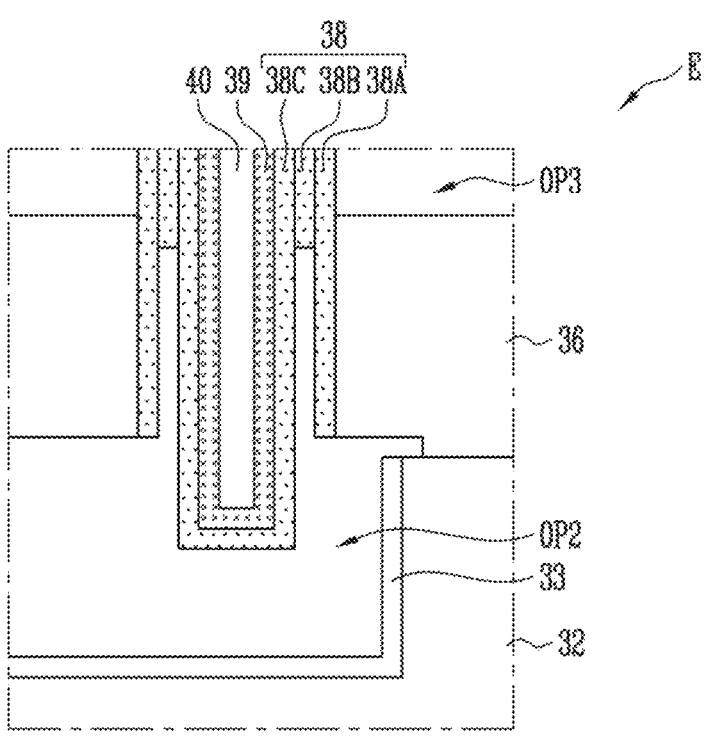
Figure 14B:
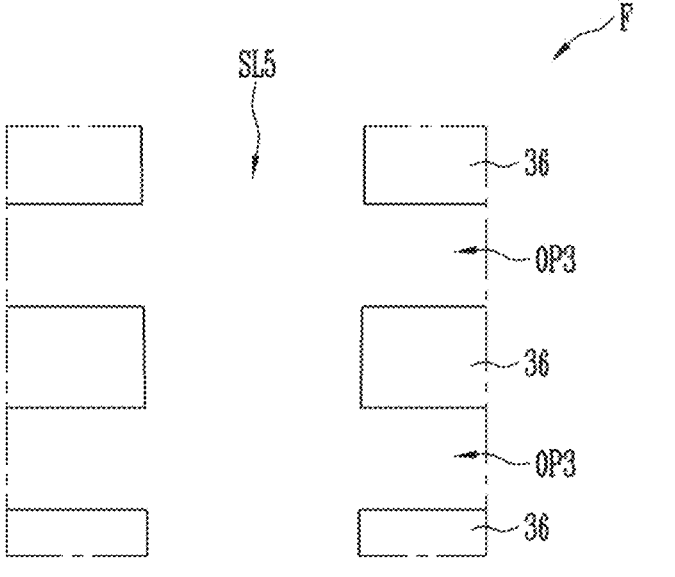

Referring to FIGS. 14A and 14B, the data storage layer 38B exposed through the second opening OP2 may be removed, so that the tunnel insulating layer 38C may be exposed through the second opening OP2. The data storage layer 38B may be removed to a greater depth than the charge blocking layer 38A. In addition, since the data storage layer 38B is removed, the second opening OP2 may be extended in a vertical direction.

When the data storage layer 38B and the first material layers 35 include nitrides, the first material layers 35 may be etched during an etching process of the second data storage layer 38B. Therefore, the third openings OP3 may be formed in regions from which the first material layers 35 are removed.

Figure 15A:
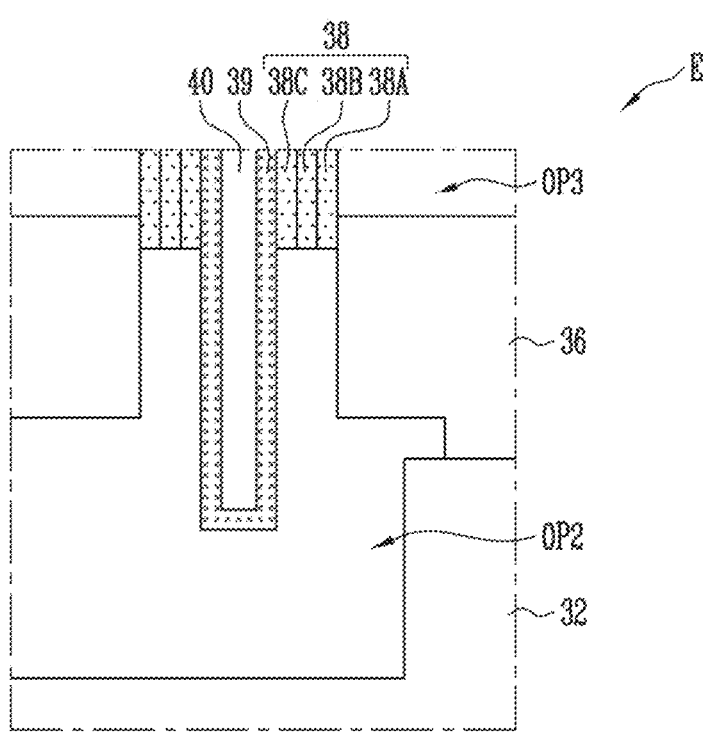
Figure 15B:
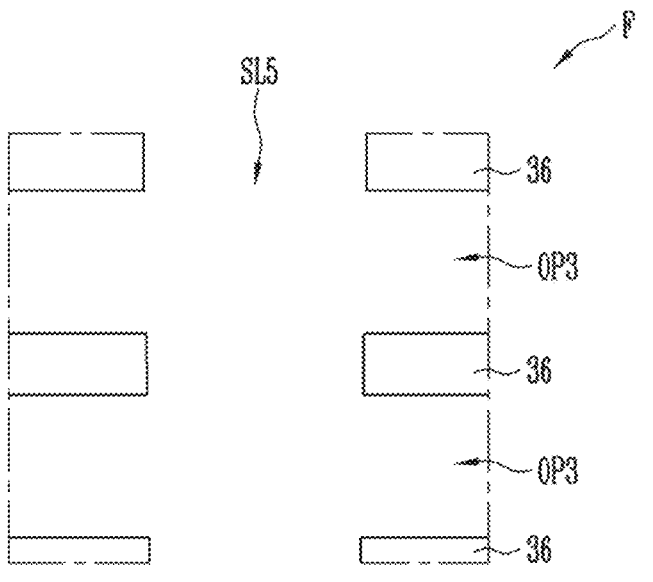

Referring to FIGS. 15A and 15B, the tunnel insulating layer 38C exposed through the second opening OP2 may be removed. The charge blocking layer 38A exposed through the second opening OP2 may also be removed. The tunnel insulating layer 38C and the charge blocking layer 38A may be removed to substantially the same depth as the data storage layer 38B is removed. As a result, the pillar 39 may be exposed through the second opening OP2. When the tunnel insulating layer 38C and the second material layers 36 include oxides, the second material layers 36 may be partially etched during the etching process of the tunnel insulating layer 38C.

In addition, the remaining second sacrificial layer 33 may be completely removed to expose the first conductive layer 32 through the second opening OP2. When the tunnel insulating layer 38C is removed, the charge blocking layer 38A exposed through the third openings OP3 may be removed partially or completely. However, the function of the charge blocking layer 38A may be complemented by additionally forming the dielectric layer 44 before the third conductive layer 43 is formed. See FIGS. 16A and 16B.

Figure 16A:
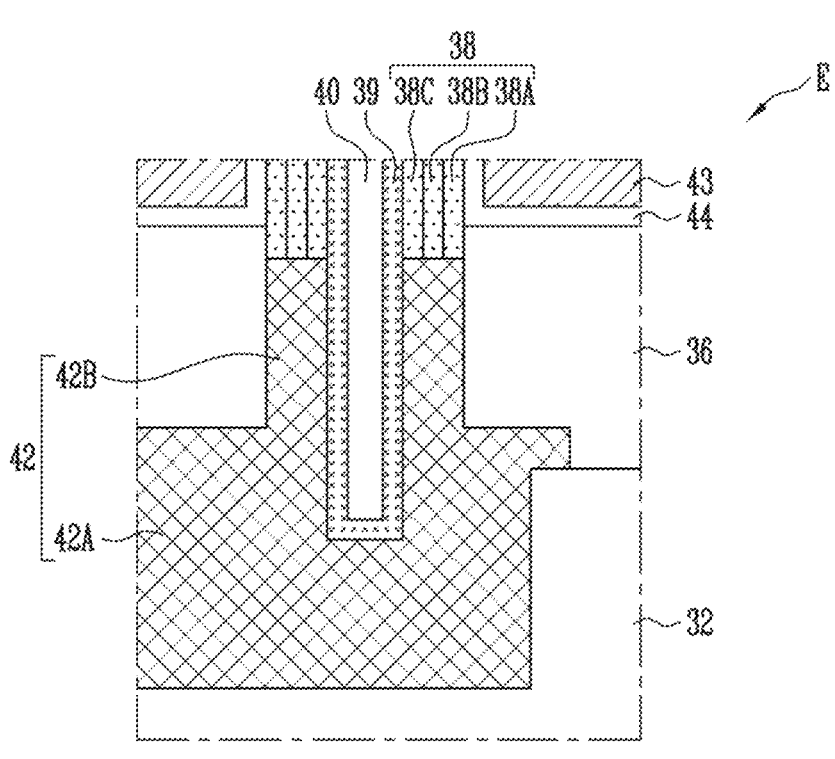
Figure 16B:
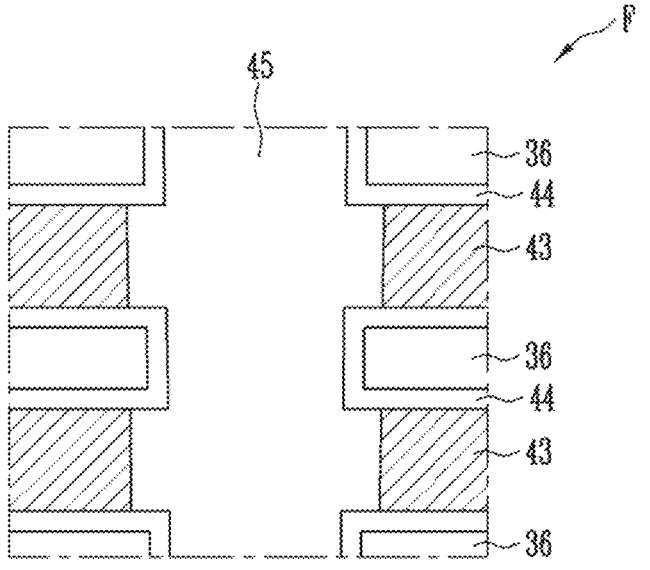

Referring to FIGS. 16A and 16B, the second conductive layer 42 may be formed between the first conductive layer 32 and the pillar 39 exposed through the second opening OP2. For example, the second conductive layer 42 may be formed by growing doped polysilicon from the first conductive layer 32, from the pillar 39, or both by selective growth. The doped polysilicon may be selectively grown in the second opening OP2, and the doped polysilicon may not be grown in the third opening OP3. In another example, the second conductive layer 42 may be formed by depositing doped polysilicon in the second opening OP2. In this example, the doped polysilicon may be partially deposited in the third opening OP3 as well as the second opening OP2. In another example, the second conductive layer 42 may be formed by siliciding the first conductive layer 32 and the pillar 39 exposed through the second opening OP2. After the first conductive layer 32 and the pillar 39 are doped with impurities, a metal layer may be formed thereon. Subsequently, a silicide layer may be formed through reaction between the metal layer and an impurity-doped region.

After the dielectric layer 44 is formed along inner surfaces of the second slit SL2, the fifth slit SL5, the sixth slit SL6 and the third openings OP3, the third conductive layers 43 may be formed in the third openings OP3. Subsequently, the fourth insulating layer 45 may be formed in the second slit SL2, the fifth slit SL5 and the sixth slit SL6.

In the electronic device described with reference to FIGS. 10A to 10C, the second conductive layer 42 and the coupling pattern 59 may be formed by applying the manufacturing method described above. For example, selective growth may be performed to form the second conductive layer 42 and the coupling pattern 59 including silicon.

FIGS. 17A to 17C and 18A to 18C are enlarged views illustrating a method of manufacturing an electronic device according to an embodiment. More specifically, FIGS. 17A and 18A correspond to the region H shown in FIGS. 10B and 10C, FIGS. 17B and 18B correspond to the region I shown in FIGS. 10B and 10C, and FIGS. 17C and 18C correspond to the region J shown in FIGS. 10B and 10C. Hereinafter, a description of common contents with earlier described embodiments is omitted.

Figure 17A:
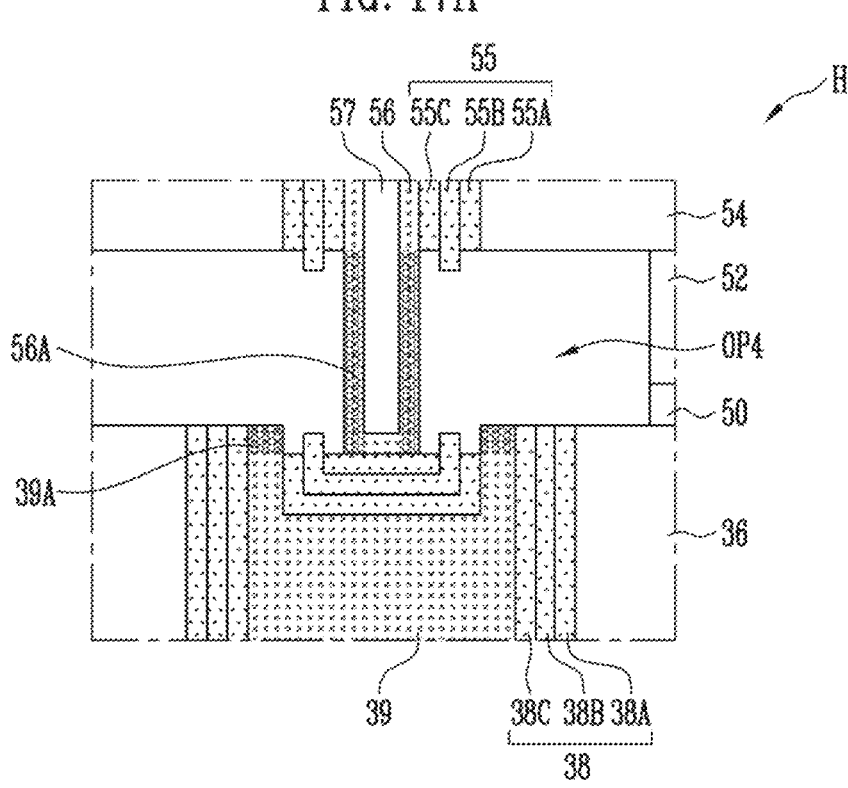
FIGS. 17A to 17C and FIGS. 18A to 18C are enlarged views illustrating a method of manufacturing an electronic device according to an embodiment.
Figure 17B:
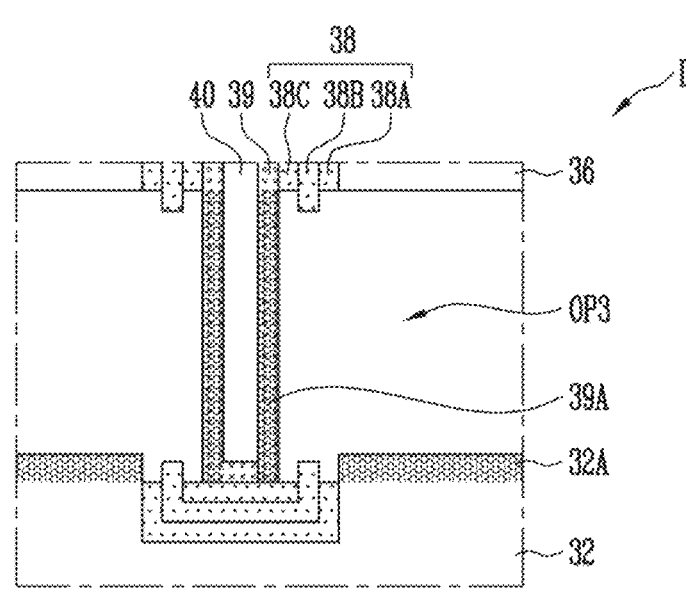
Figure 17C:
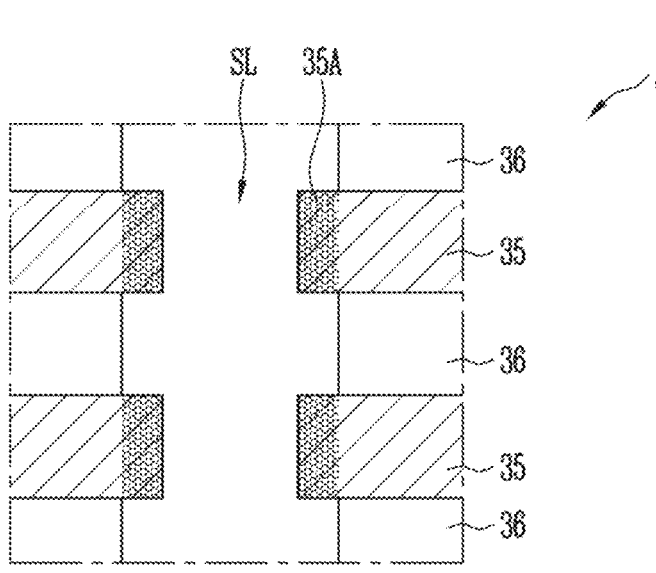

Referring to FIGS. 17A to 17C, the first multilayer dielectric layer 38, the first sacrificial layer 34 and the second sacrificial layer 33 exposed through the third opening OP3 may be removed. In addition, the second multilayer dielectric layer 55, the third sacrificial layer 50 and the fourth sacrificial layer 51 exposed through the fourth opening OP4 may be removed, so that the first pillar 39 and the first conductive layer 32 may be exposed through the third opening OP3, and the first pillar 39 and the second pillar 56 may be exposed through the fourth opening OP4.

When the first material layer 35 includes a conductive layer such as a doped silicon layer, the first material layer 35 may not be removed when first and second data storage layers 38B and 55B are removed. In addition, when the first and second tunnel insulating layers 38C and 55C and the first and second charge blocking layers 38A and 55A are removed, the second material layers 36 may be removed. As a result, an inner wall of the slit SL may be formed unevenly and the first material layers 35 may protrude.

Subsequently, the first pillar 39, the second pillar 56 and the first conductive layer 32 exposed by removing the second material layers 36 may be doped with impurities. For example, a heat treatment process may be performed in a gas atmosphere containing an impurity such as $PH_3$ gas, or plasma doping using N type impurities such as As or P may be performed. As a result, impurity-doped regions 39A, 56A, and 32A may be formed. An impurity-doped region 35A may be formed in each of the first material layers 35.

Figure 18A:
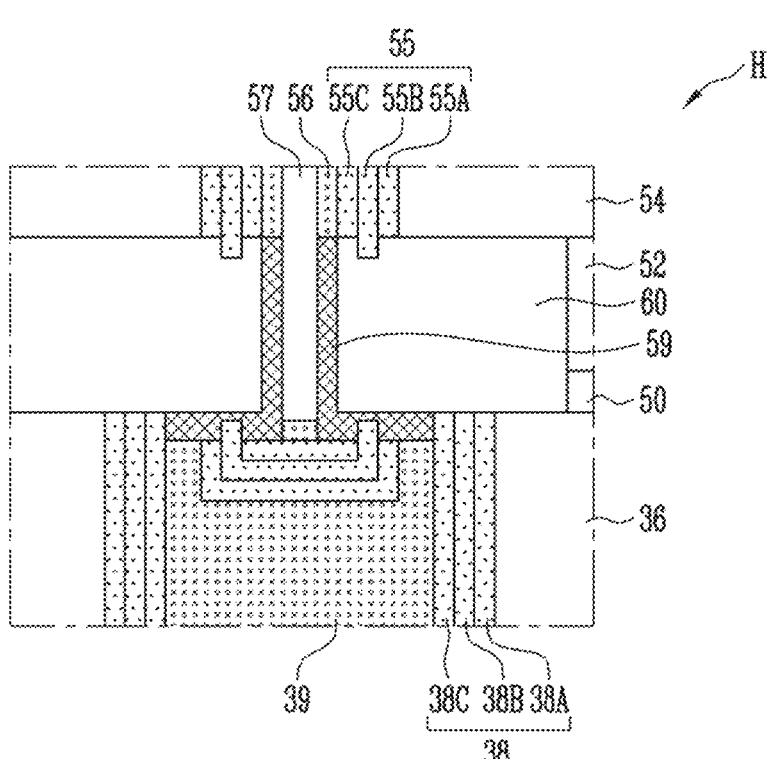
Figure 18B:
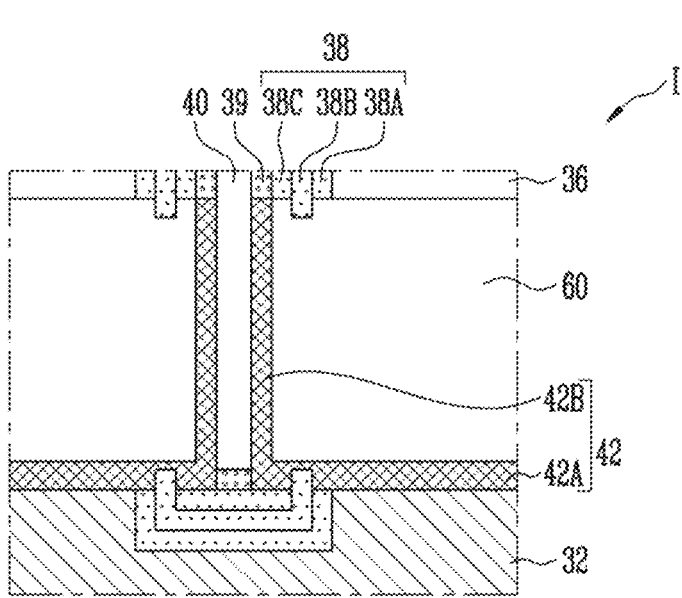
Figure 18C:
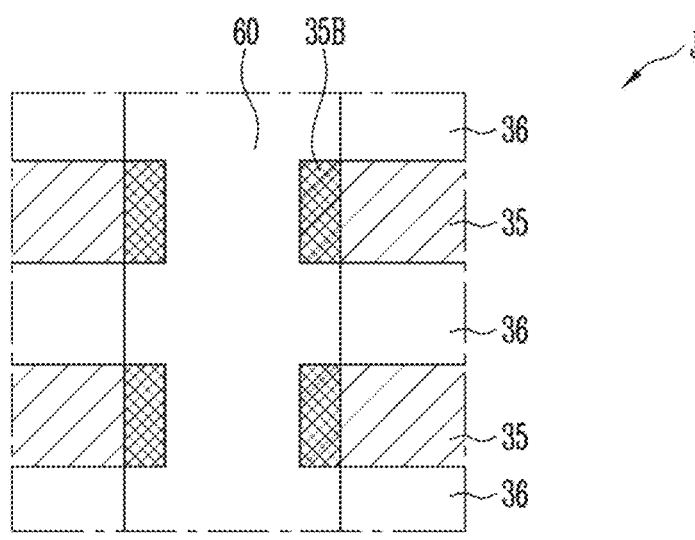

Referring to FIGS. 18A to 18C, the impurity-doped region 39A, 56A, and 32A may be silicided to form the second conductive layer 42 and the coupling pattern 59. For example, a metal layer may be formed on the impurity-doped regions 39A, 56A, and 32A through the slit SL and the third and fourth openings OP3 and OP4. The metal layer may include cobalt, nickel, and the like. Subsequently, the impurity-doped regions 39A, 56A, and 32A may be reacted with the metal layer and silicided, so that the second conductive layer 42 and the coupling pattern 59 including the silicide layer may be formed. In addition, when the first material layers 35 include polysilicon, a silicide layer 35B may also be formed in the impurity-doped region 35A of each of the first material layers 35.

The impurity-doped region 39A formed at the first pillar 39 and the impurity-doped region 32A formed at the first conductive layer 32 may be coupled to each other during silicidation to form the second conductive layer 42. In addition, the impurity-doped region 39A formed at the first pillar 39 and the impurity-doped region 56A formed at the second pillar 56A may be coupled to each other during silicidation to form the coupling pattern 59.

Figure 19:
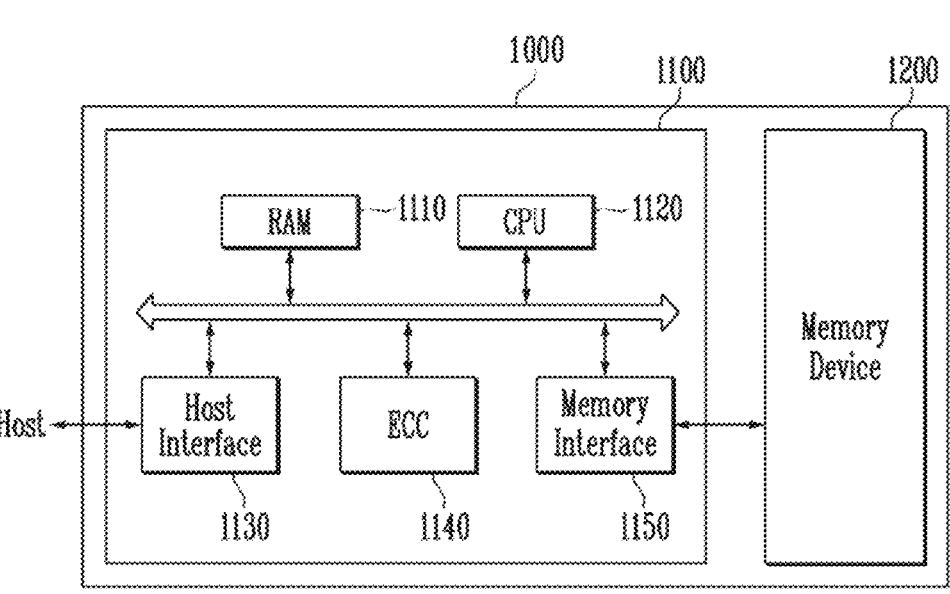
FIGS. 19 and 20 are block diagrams illustrating the configuration of a memory system according to an embodiment.

FIG. 19 is a block diagram illustrating a memory system according to an embodiment.

As illustrated in FIG. 19, a memory system 1000 according to an embodiment may include a memory device 1200 and a controller 1100.

The memory device 1200 may be used to store various types of data such as text, graphic, and software code. The memory device 1200 may be a non-volatile memory and include the structure described above and shown in FIGS. 1A to 18C. The memory device 1200 may include a first source layer including a trench, a second source layer formed in the trench, a structure including a plurality of conductive layers and a plurality of insulating layers formed alternately on the first and second source layers, and a plurality of channel layers passing through the structure and extending into the second source layer, in which the second source layer includes a base portion electrically connecting the channel layers adjacent to each other and a plurality of protruding portions protruding from the base portion, extending into the structure and partially surrounding the plurality of channel layers. Since the memory device 1200 is configured and manufactured in the above-described manner, a detailed description thereof will be omitted.

The controller 1100 may be coupled to a host and the memory device 1200, and may access the memory device 1200 in response to a request from the host. For example, the controller 1100 may control read, write, erase and background operations of the memory device 1200.

The controller 1100 may include a random access memory (RAM) 1110, a central processing unit (CPU) 1120, a host interface 1130, an error correction code (ECC) circuit 1140 and a memory interface 1150.

The RAM 1110 may function as an operation memory of the CPU 1120, a cache memory between the memory device 1200 and the host, and a buffer memory between the memory device 1200 and the host. The RAM 1110 may be replaced with a static random access memory (SRAM) or a read only memory (ROM).

The CPU 1120 may be configured to control the general operation of the controller 1100. For example, the CPU 1120 may be configured to operate firmware such as a flash translation layer (FTL) stored in the RAM 1110.

The host interface 1130 may interface with the host. For example, the controller 1100 may communicate with the host through various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, a private protocol, or a combination thereof.

The ECC circuit 1140 may detect and correct errors included in data, which is read from the memory device 1200, by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data. The buffer memory may temporarily store data externally transferred through the host interface 1130, or temporarily store data transferred from the memory device 1200 through the memory interface 1150. The controller 1100 may further include a read only memory (ROM) storing code data to interface with the host.

Since the memory system 1000 according to an embodiment includes the memory device 1200 allowing for easy manufacture and having improved characteristics, characteristics of the memory system 1000 may also be improved.

Figure 20:
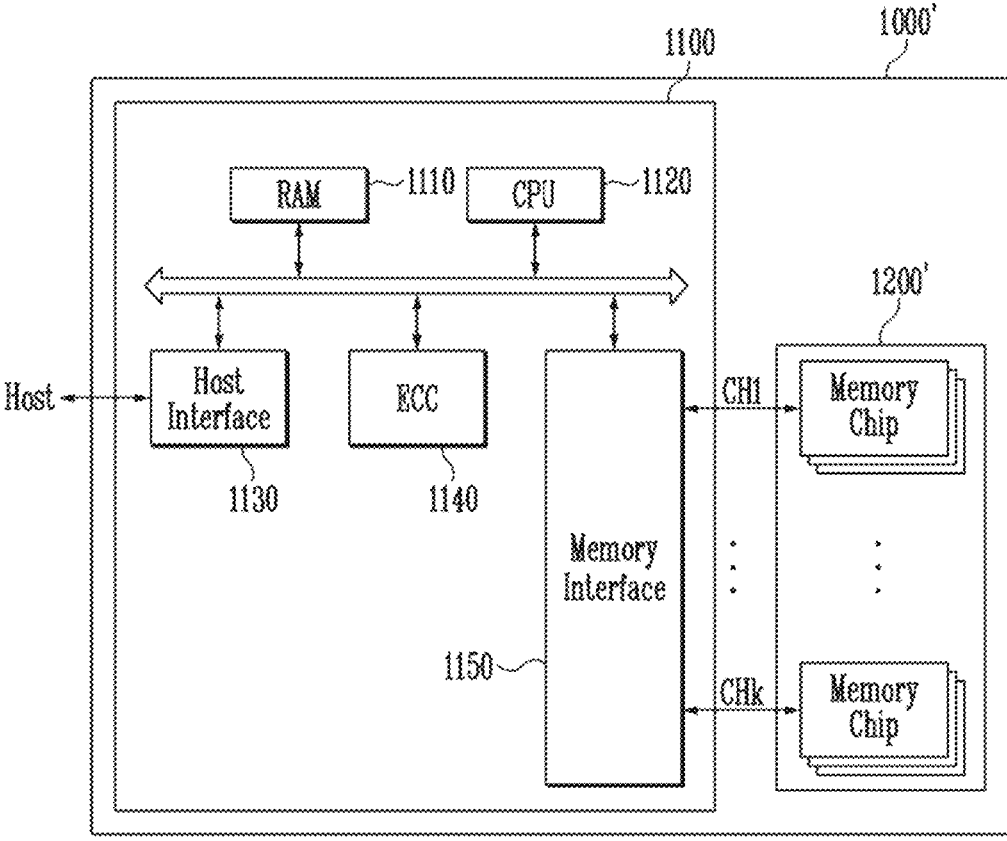

FIG. 20 is a block diagram illustrating a memory system according to an embodiment. Hereinafter, descriptions of components already mentioned above are omitted.

As illustrated in FIG. 20, a memory system 1000' according to an embodiment may include a memory device 1200' and the controller 1100. The controller 1100 may include the RAM 1110, the CPU 1120, the host interface 1130, the ECC circuit 1140 and the memory interface 1150.

The memory device 1200' may be a non-volatile memory device. The memory device 1200' may include a first source layer including a trench, a second source layer formed in the trench, a structure including a plurality of conductive layers and a plurality of insulating layers formed alternately on the first and second source layers, and a plurality of channel layers passing through the structure and extending into the second source layer, in which the second source layer includes a base portion electrically connecting the channel layers adjacent to each other and a plurality of protruding portions protruding from the base portion, extending into the structure and partially surrounding the plurality of channel layers. Since the memory device 1200' is configured and manufactured in the same manner as the memory devices 1200, a detailed description thereof will be omitted.

The memory device 1200' may be a multi-chip package composed of a plurality of memory chips. The plurality of memory chips may be divided into a plurality of groups. The plurality of groups may communicate with the controller 1100 through first to k-th channels CH1 to CHk. In addition, memory chips included in a single group may be suitable for communicating with the controller 1100 through a common channel. The memory system 1000' may be modified so that a single memory chip may be coupled to a single channel.

As described above, according to an embodiment, since the memory system 1000' includes the memory device 1200' having improved structural stability, characteristics of the memory system 1000' may also be improved. In addition, since the memory device 1200' is formed using a multi-chip package, data storage capacity and driving speed of the memory system 1000' may be further increased.

Figure 21:
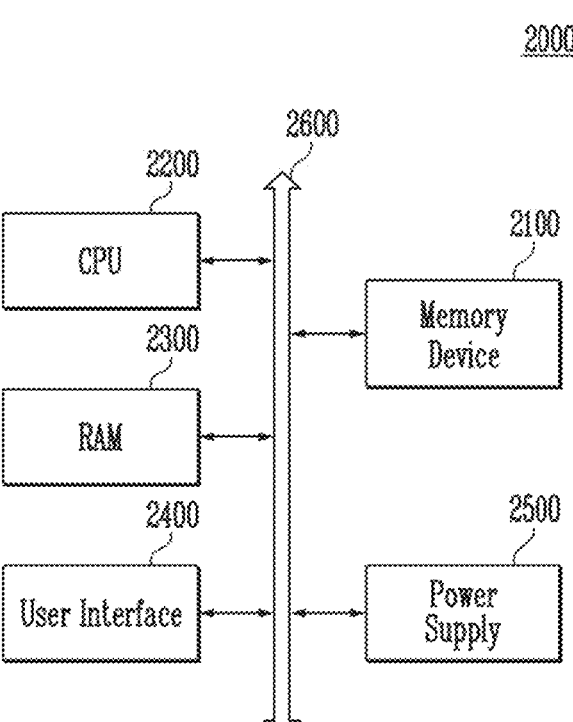
FIGS. 21 and 22 are block diagrams illustrating the configuration of a computing system according to an embodiment.

FIG. 21 is a block diagram illustrating a computing system according to an embodiment. Hereinafter, descriptions of components already mentioned above are omitted.

As illustrated in FIG. 21, a computing system 2000 according to an embodiment may include a memory device 2100, a CPU 2200, a random-access memory (RAM) 2300, a user interface 2400, a power supply 2500 and a system bus 2600.

The memory device 2100 may store data, which is input through the user interface 2400, and data, which is processed by the CPU 2200. The memory device 2100 may be electrically coupled to the CPU 2200, the RAM 2300, the user interface 2400, and the power supply 2500. For example, the memory device 2100 may be coupled to the system bus 2600 through a controller (not illustrated) or be directly coupled to the system bus 2600. When the memory device 2100 is directly coupled to the system bus 2600, functions of the controller may be performed by the CPU 2200 and the RAM 2300.

The memory device 2100 may be a non-volatile memory. The memory device 2100 may be the semiconductor memory strings described above with reference to FIGS. 1A to 18C. The memory device 2100 may include a first source layer including a trench, a second source layer formed in the trench, a structure including a plurality of conductive layers and a plurality of insulating layers formed alternately on the first and second source layers, and a plurality of channel layers passing through the structure and extending into the second source layer, in which the second source layer includes a base portion electrically connecting the channel layers adjacent to each other and a plurality of protruding portions protruding from the base portion, extending into the structure and partially surrounding the plurality of channel layers. Since the memory device 2100 is configured and manufactured in the same manner as the memory devices 1200 or 1200', a detailed description thereof will be omitted.

In addition, as described above with reference to FIG. 20, the memory device 2100 may be a multi-chip package composed of a plurality of memory chips.

The computing system 2000 having the above-described configuration may be one of various components of an electronic device, such as a computer, an ultra-mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environments, one of various electronic devices for home networks, one of various electronic devices for computer networks, one of various electronic devices for telematics networks, an RFID device, and/or one of various devices for computing systems, etc.

As described above, since the computing system 2000 according to an embodiment includes the memory device 2100 having improved structural stability, simplified manufacturing processes, and increased degree of integration, stability and data storage capacity of the computing system 2000 may be improved.

Figure 22:
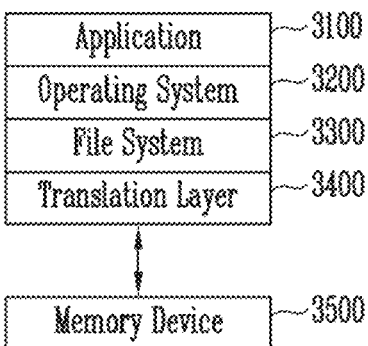

FIG. 22 is a block diagram illustrating a computing system according to an embodiment.

As illustrated in FIG. 22, a computing system 3000 according to an embodiment may include a software layer that has an operating system 3200, an application 3100, a file system 3300, and a translation layer 3400. The computing system 3000 may include a hardware layer such as a memory system 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data and store them in the memory device 3500 according to given rules. The file system 3300 may be determined depending on the operating system 3200 that is used in the computing system 3000. For example, when the operating system 3200 is a Microsoft Windows-based system, the file system 3300 may be a file allocation table (FAT) or an NT file system (NTFS). In addition, when the operating system 3200 is a Unix/Linux-based system, the file system 3300 may be an extended file system (EXT), a Unix file system (UFS) or a journaling file system (JFS).

FIG. 22 illustrates the operating system 3200, the application 3100, and the file system 3300 in separate blocks. However, the application 3100 and the file system 3300 may be included in the operating system 3200.

The translation layer 3400 may translate an address suitable for the memory device 3500 in response to a request from the file system 3300. For example, the translation layer 3400 may translate a logic address, which is generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL), or the like.

The memory device 3500 may be a non-volatile memory and include the memory string described above with reference to FIGS. 1A to 18C. The memory device 3500 may include a first source layer including a trench, a second source layer formed in the trench, a structure including a plurality of conductive layers and a plurality of insulating layers formed alternately on the first and second source layers, and a plurality of channel layers passing through the structure and extending into the second source layer, in which the second source layer includes a base portion electrically connecting the channel layers adjacent to each other and a plurality of protruding portions protruding from the base portion, extending into the structure and partially surrounding the plurality of channel layers. Since the memory device 3500 is configured and manufactured in the same manner as the memory devices 1200, 1200' or 2100, a detailed description thereof will be omitted.

The computing system 3000 having the above-described configuration may be divided into an operating system layer that is operated in an upper layer region and a controller layer that is operated in a lower level region. The application 3100, the operating system 3200, and the file system 3300 may be included in the operating system layer and driven by an operation memory. The translation layer 3400 may be included in the operating system layer or the controller layer.

As described above, since the computing system 3000 according to an embodiment includes the memory device 3500 capable of being manufactured by a simplified process and having improved characteristics, characteristics of the computing system 3000 may also be improved.

According to an embodiment, manufacturing processes may be easier to perform, and characteristics of an electronic device may be improved.

What is claimed is:

1. An electronic device comprising:
a first conductive layer;
a second conductive layer connected to the first conductive layer;
a stacked structure including conductive layers and insulating layers which are alternately stacked over the second conductive layer;
a channel layer passing through the stacked structure and including a contact surface connected to the second conductive layer; and
a memory layer between the channel layer and the stacked structure,
wherein the memory layer is not interposed between the channel layer and the second conductive layer.

2. An electronic device comprising:
a first conductive layer;
a second conductive layer connected to the first conductive layer;
a stacked structure including conductive layers and insulating layers which are alternately stacked over the second conductive layer;
a channel layer passing through the stacked structure and including a contact surface connected to the second conductive layer; and
a memory layer between the channel layer and the stacked structure,
wherein the conductive layers include a selection gate of a selection transistor and gate electrodes of memory cells, and wherein the selection gate is located between the first conductive layer and the gate electrodes.

3. The electronic device of claim 2, further comprising:

lower insulating layers passing through the selection gate and spaced apart from each other; and a slit passing through the selection gate and the gate electrodes, wherein the slit includes two ends respectively connected to the lower insulating layers, and wherein each of the gate electrodes covers the lower insulating layers.

4. The electronic device of claim 3, wherein the selection gate is separated into line patterns by the lower insulating layers and the slit.

5. The electronic device of claim 4, wherein the line patterns are spaced apart from each other in a first direction, wherein the slit extends in a second direction intersecting the first direction, and wherein the lower insulating layers are spaced apart from each other in the second direction.

6. The electronic device of claim 3, wherein each of the selection gate and the gate electrodes includes a first sidewall facing the slit, wherein each of the insulating layers includes a second sidewall facing the slit, and wherein the second sidewall further protrudes towards the slit than the first sidewall.

7. An electronic device comprising:

a first conductive layer;

a second conductive layer connected to the first conductive layer;

a stacked structure including conductive layers and insulating layers which are alternately stacked over the second conductive layer;

a channel layer passing through the stacked structure and including a contact surface connected to the second conductive layer;

a memory layer between the channel layer and the stacked structure; and a slit insulating layer passing through the insulating layers of the stacked structure, wherein the slit insulating layer includes protrusions located between the insulating layers and located on sidewalls of the conductive layers.

8. An electronic device comprising:

a first conductive layer;

a second conductive layer connected to the first conductive layer;

a stacked structure including conductive layers and insulating layers which are alternately stacked over the second conductive layer;

a channel layer passing through the stacked structure and including a contact surface connected to the second conductive layer; and a memory layer between the channel layer and the stacked structure, wherein the stacked structure includes a first structure and a second structure over the first structure, wherein the conductive layers includes first and second gate electrodes of memory cells, wherein the first structure includes the first gate electrodes spaced apart from each other at a first interval, wherein the second structure includes the second gate electrodes spaced apart from each other at a second interval, and wherein one first gate electrode and one second gate electrode adjacent to each other, among the first and second gate electrodes, are spaced apart from each other at a third interval greater than each of the first interval and the second interval.

* * * * *